United States Patent [19]

Shibasaki et al.

[11] Patent Number: 5,198,795
[45] Date of Patent: Mar. 30, 1993

[54] MAGNETOELECTRIC TRANSDUCER AND PROCESS FOR PRODUCING THE SAME

[75] Inventors: Ichiro Shibasaki; Takashi Ito; Yuichi Kanayama, all of Fuji, Japan

[73] Assignee: Asahi Kasei Kogyo Kabushiki Kaisha, Osaka, Japan

[21] Appl. No.: 679,181

[22] Filed: Apr. 2, 1991

[30] Foreign Application Priority Data

Apr. 4, 1990 [JP] Japan .................................. 2-88190

[51] Int. Cl.⁵ .......................................... H01L 43/02
[52] U.S. Cl. .................................. 328/32 H; 437/918; 324/207.2
[58] Field of Search ............................. 338/324, 32 R; 324/207.2, 207.1; 357/1, 51, 27; 437/918

[56] References Cited

U.S. PATENT DOCUMENTS

| | | | |
|---|---|---|---|
| 3,617,975 | 11/1971 | Wieder | 338/32 H |
| 4,296,424 | 10/1981 | Shibasaki et al. | 357/1 |
| 4,401,966 | 8/1983 | Ohmura et al. | 338/32 R |
| 4,568,905 | 2/1986 | Suzuki et al. | |
| 4,584,552 | 4/1986 | Suzuki et al. | 338/32 H |
| 4,908,685 | 3/1990 | Shibasaki et al. | 357/27 |
| 4,926,154 | 5/1990 | Heremans et al. | 338/32 R |
| 4,939,456 | 7/1990 | Morelli et al. | 338/32 R X |
| 4,978,938 | 12/1990 | Partin et al | 338/32 R |

FOREIGN PATENT DOCUMENTS 61-20378  7/1984  Japan .
2081973A  2/1982  United Kingdom .

Primary Examiner—Marvin M. Lateef
Attorney, Agent, or Firm—Finnegan, Henderson, Farabow, Garrett and Dunner

[57] ABSTRACT

An InAs thin film formed by epitaxial growth on an insulating or semi-insulating substrate has a structure in which a portion near the interface of the InAs thin film with the substrate is a lower electron mobility portion, and another portion more remote from that interface is a higher electron mobility portion. The thin film is doped with donor impurity atoms in at least the high mobility portion. A magnetoelectric transducer has the InAs thin film as a magneto-sensitive portion. A magnetic amplifying type magnetoelectric transducer has a body of a ferromagnetic material arranged in the vicinity of the magneto-sensitive portion.

20 Claims, 20 Drawing Sheets

MAGNETOELECTRIC TRANSDUCER AND PROCESS FOR PRODUCING THE SAME

BACKGROUND OF THE INVENTION

1. Field of the Invention

The present invention relates to magnetoelectric or magnetoresistive transducers and processes for producing the same and more particularly to a transducer having as a magneto-sensitive portion an InAs thin film with a resistance value which shows a very small temperature dependence and a process for producing the same.

2. Description of the Prior Art

Conventional methods for producing InAs Hall elements include various methods. For example, the first method includes the steps of preparing a single crystal of InAs, slicing and polishing it to obtain a thin material, and producing an InAs Hall element by using the thin material. The second method includes the steps of depositing an InAs polycrystal thin film on a substrate of mica, peeling it off from the substrate, bonding it to a substrate made of materials such as ferrite, and producing an InAs Hall element by using the InAs polycrystal thin film. The third method uses an InAs thin film, which has been grown on a GaAs substrate, for producing an InAs Hall element.

However, according to the first method, it is difficult to produce an InAs thin film in a constant thickness on an industrial scale, particularly it is very difficult to make the InAs thin film to a thickness of 1 $\mu$m or less, thus failing to meet demand for mass production. The second method can provide an InAs thin film in a constant thickness but it involves formation of an insulating layer made of an organic substance as an adhesive between the thin film and the ferrite substrate. The organic substance layer as an adhesive is not suitable material for InAs Hall element which is operated at high temperatures exceeding 100° C. because of the instability of it at high temperatures. Therefore, stable driving of this Hall element is impossible at high temperatures exceeding 100° C. The Hall element produced by the third method, which does not involve the organic layer between the InAs thin film and the GaAs substrate, can be operated even at high temperatures such as exceeding 100° C. However, it is known that because the thin film of InAs and the substrate of GaAs are different materials from each other, the single crystal of InAs in the vicinity of the interface with the GaAs substrate has many lattice defects due to misalignment of lattices with the GaAs substrate. A crystal lattice of the InAs near the interface with GaAs substrate is somewhat disorganized. Hence, when the InAs thin film was used as a Hall element, a large temperature dependence of the resistance was observed. It has a characteristics that the resistance value decreases at the temperatures above 60° C. Hence, when used at a temperatures exceeding 100° C. under a constant voltage driving, the Hall element using the InAs thin film generates heat due to the above-described decrease in resistance as the temperature of the Hall element increases. Since this heat generation causes the temperature of the Hall element to rise, the Hall element is accelerated as a feedback phenomenon. This causes a self-breaking type failure mode for Hall elements at constant voltage driving. This is a serious defect in driving Hall elements. In order to overcome this defect, it is required to change the temperature coefficient of the resistance which is negative at 100° C. or higher to nearly null or positive.

Generally, it is possible to reduce temperature-dependent change in resistance of the InAs thin film by increasing electron concentration. In the case of an InAs thin film, its sheet resistance values suitable for Hall element use depends on the design conditions and input voltage values under which Hall elements are driven. Therefore, a lower limit value of the sheet resistance is determined, and this value restricts and determines the corresponding upper limit of the electron concentration. Within this limitation, it is expectable to reduce the temperature-dependent change in resistance in resistivity of the InAs Hall element or InAs thin film from room temperature to the vicinity of 100° C. by merely increasing the electron concentration. However, it is impossible to reduce the temperature-dependent change in the resistance by increasing the electron concentration in the temperatures above 100° C. This is because the temperature dependence in electron mobility dominates the temperature dependence in the resistance at high temperatures exceeding 100° C. Accordingly, it has heretofore been found no technique that can reduce the temperature-dependent change in resistance of an InAs thin film having a thickness of 1.4 $\mu$m or less at 100° C. or higher. In other words, it is a novel technique to reduce temperature-dependent changes at 100° C. or higher. The reduction of the temperature-dependent change in the resistance of an InAs thin film having a thickness of 1.4 $\mu$m or less is important for producing practically useful Hall elements. This is because, an InAs thin film having such a small thickness formed on a substrate has different temperature dependence in electron mobility as compared with bulk InAs single crystal case, and behaviors of these temperature-dependent changes have not ever been understood.

In production of practical Hall elements, attempt to make small sized Hall element chips (0.4 mm square or smaller) in view of convenience of application and cost requirement causes the heat generation by consumption of electric power, heat concentration on a small sized Hall element chip and rising of the chip temperature. Then, the rising of the chip temperature leads to a self-breaking type failure. Therefore, it is necessary to reduce the temperature-dependent change in resistance, and no decrease in resistance with the increase in temperature is desired. However, this technology has not been achieved up to the present.

SUMMARY OF THE INVENTION

Accordingly, it is an object of the present invention to overcome the above-described problems and provide a magnetoelectric transducer and a process for producing the same, which can be used at a temperature of 100° C. or higher up to the vicinity of 150° C.

It is another object of the present invention to provide a magnetoelectric transducing device using such a magnetoelectric transducer.

It is still another object of the present invention to provide a magnetic switch using such a magnetoelectric transducer.

It is yet another object of the present invention to provide an InAs Hall element using as a magneto-sensitive portion, an InAs thin film of 1.4 $\mu$m or less in thickness having characteristics such that resistance does not decrease with increase in temperature and having a structure in which electron mobility varies in the direction of thickness.

The foregoing and other objects of the present invention can effectively be achieved by providing a magnetoelectric transducer, comprising
an insulating substrate; and
an InAs thin film formed on the insulating substrate as a magneto-sensitive portion;
wherein the InAs thin film is formed by epitaxial growth to a thickness of 0.2 to 1.4 μm and has two layers different in electron mobility with each other, the layers including a higher electron mobility layer and a lower electron mobility layer, the higher electron mobility layer being doped with a donor impurity.

Here, the donor impurity may be at least one element selected from the group consisting of Si, S, Ge, Se, and Sn.

The magneotoelectric transducer may further include a body of a ferromagnetic material arranged close to at least one side of the magneto-sensitive portion. The magnetoelectric transducer may be a Hall element.

According to the second aspect of the present invention, there is provided a magnetoelectric transducing device comprising
a magnetoelectric transducer including,
an insulating substrate, and an InAs thin film formed on the insulating substrate as a magneto-sensitive portion, wherein the InAs thin film is formed by epitaxial growth to a thickness of 0.2 to 1.4 μm and has two layers different in electron mobility, the layers including a higher electron molbility layer and a lower electron mobility layer, the higher electron mobility layer being doped with a donor impurity; and
a circuit element connected electrically with the magnetoelectric transducer;
wherein the magnetoelectric transducer and the circuit element being formed in the same package.

Here, the magnetoelectric transducing device, may further include a body of a ferromagnetic material arranged close to at least one side of the magneto-sensitive portion.

The magnetoelectric transducer may be a Hall element.

The donor impurity may be at least one element selected from the group consisting of Si, S, Ge, Se, and Sn.

According to the third aspect of the present invention, there is provided a magnetic switch comprising
a magetoelectric transducer including,
an insulating substrate, and an InAs thin film formed on the insulating substrate as a magneto-sensitive portion, wherein the InAs thin film is formed by epitaxial growth to a thickness of 0.2 to 1.4 μm and has two layers different in electron mobility, the layers including a higher electron mobility layer and a lower electron mobility layer, the higher electron mobility layer being doped with a donor impurity; and
means for applying a magnetic field to drive the magnetoelectric transducer.

Here, the magnetoelectric transducing device may further include a body of a ferromagnetic material arranged close to at least one side of the magneto-sensitive portion.

The donor impurity may be at least one element selected from the group consisting of Si, S, Ge, Se, and Sn.

The magnetoelectric transducer may be a Hall element.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Explanation will be hereinafter made on experimental procedures which have led to the present invention.

That is, the present inventors have analyzed electron transport phenomenon with respect to an InAs thin film formed on a substrate by epitaxial growth and have tried to improve the characteristics of the InAs thin film by doping donor impurity atoms into the film. Further, taking into consideration phenomenon that the lattice of the InAs layer is disordered in a portion close to an interface between the substrate and the InAs layer due to lattice mismatch on that interface, the present inventors have studied a structure of transducer which can minimize contribution of that lattice-disordered portion to electric conduction.

Figure 4:
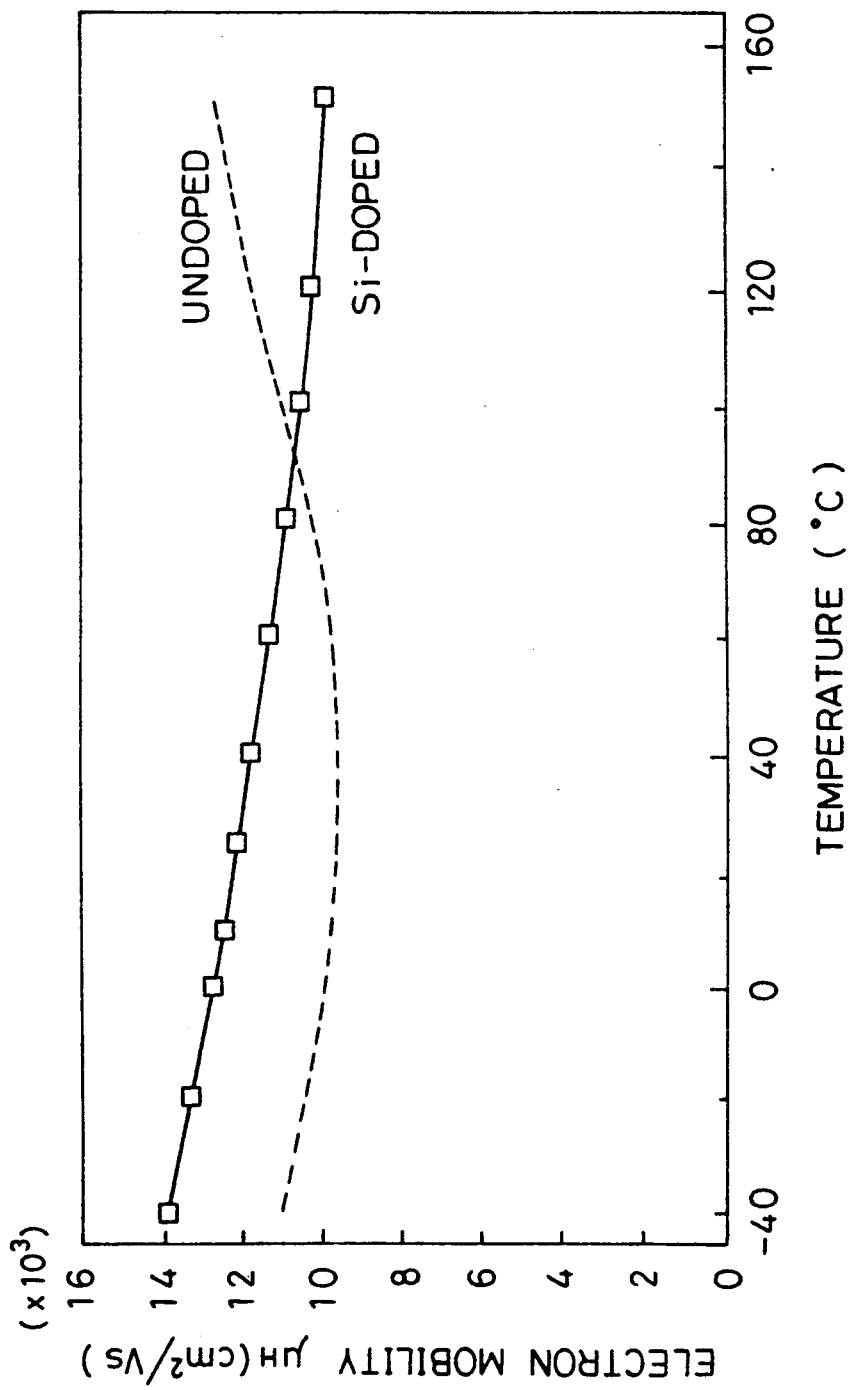
FIG. 4 is a graph illustrating the temperature dependence of electron mobility of the InAs thin films used in the present invention.

In fact, the present inventors have tried to dope an InAs thin film having a thickness of 1.4 μm or less grown on a GaAs substrate with Si which acts as a donor impurity for InAs. As a result, it has been found a phenomenon that the concentration of electron in the InAs thin film increases accordingly as the amount of doped Si increases as seen in Table 1 where the amount of doped Si is increased with each sample number. It has been further found phenomena that electron mobility also increases with increase in the electron concentration, despite the fact that the conditions of crystal growth are the same. FIG. 4 is a graph illustrating temperature dependence in electron mobility of the Si-doped InAs thin film of the present invention as compared with an undoped one. A large difference in the temperature dependence between Si-doped InAs thin film and the undoped one has been observed.

TABLE 1

Relation between electron concentration and electron mobility

| Sample No. | Electron Concentration* ($\times 10^{16}$ cm$^{-3}$) | Electron Mobility (cm$^2$/Vs) |
|---|---|---|
| 1 (Undoped) | 6.0 | 7,000 |
| 2 (Si-Doped) | 7.1 | 11,600 |
| 3 (Si-Doped) | 8.5 | 13,500 |
| 4 (Si-Doped) | 9.3 | 13,600 |
| 5 (Si-Doped) | 15.7 | 14,600 |

Note Film thickness: 0.4 μm;
The amount of doped Si is increased with each sample number.
*Electron concentration was obtained by Hall measurement.

Further, in order to study the phenomena more deeply, experiments have been carried out to examine the relation between position of doped Si into InAs thin films as indicated in Table 2 and electron mobility in their films. As seen clearly in Table 2, the InAs thin film No. 4, in which the vicinity of the surface is doped with Si, indicated a high electron mobility, and accordingly, it is found that the electron mobility of the InAs thin film is increased by Si-doping. On the other hand, when an InAs thin film No. 2 in the vicinity of its interface with a substrate is doped with Si, there is observed no increase in the electron mobility. Further, when over all the InAs thin film No. 3 is uniformly doped with Si, a large increase in the electron mobility occurs. From these it is found that there is a large variation of electron mobility in the thickness direction for the InAs thin film.

That is, Si-doping in a portion near the interface with the substrate results in a small change in the electron mobility while Si-doping in a portion remote from the interface with the substrate causes a large increase in the electron mobility. Hence, it may be presumed that the InAs thin film has a two-layer structure having a layer which is remote from the interface with the substrate and has a high electron mobility, and the other which is in the vicinity of the interface with the substrate and has a low electron mobility.

TABLE 2

Relation between position of Si doping and electron mobility of InAs thin film

| Sample No. | Position of Si Doping | Electron mobility (cm$^2$/Vs) |
|---|---|---|
| 1 | Undoped | 7,000 |
| 2 | Doped up to 0.2 μm from interface with substrate | 8,500 |
| 3 | Doped uniformly over all thin film | 14,000 |
| 4 | Doped up to 0.1 μm from surface | 13,000 |

Note: Film thickness: 0.4 μm; Dopant: Si

Further, Table 3 shows relation between thickness of the Si-doped InAs thin film and its electron mobility. From Table 3, it can be seen that the electron mobility increases accordingly as the film thickness increases. Particularly, the electron mobility drastically changes between 0.1 μm and 0.2 μm. In this range, the amount of change is the maximum and the electron mobility shows abrupt increase. This suggests that the InAs thin film is of a structure in which the electron mobility is low at a near portion of the interface with the substrate but it is very high in a portion remote from the interface. More particularly, up to 0.1 μm from the interface is a layer with a low electron mobility and from a boundary of 0.1 μm to the surface there is a layer with a very high electron mobility, thus forming the two-layer structure with the layers having electron mobilities different from each other.

TABLE 3

Relation between electron mobility and film thickness of Si-doped InAs thin film

| Film Thickness ($\mu$m) | Electron mobility (cm$^2$/Vs) |
| --- | --- |
| 0.1 | 3,000 |
| 0.2 | 8,500 |
| 0.4 | 14,000 |
| 0.7 | 17,000 |
| 1.4 | 20,000 |

To further study in detail by inverse process, the above-described relation between electron mobility and film thickness, Si-doped InAs was grown to a thickness of 0.60 $\mu$m on a GaAs substrate and its characteristics were measured. Then, the InAs layer was serially thinned by etching and its characteristics were measured after every thinning. Table 4 shows the obtained results. The results in Table 4 indicate that the electron mobility of InAs near the interface is low whereas that of InAs remote from the interface is high. Here, presence of two-layer structure with different electron mobilities was confirmed. Further, in Table 4, electron concentration is constant even when film thickness is reduced but sheet electron concentration is reduced as film thickness is decreased.

TABLE 4

Distribution of electron mobility, electron concentration and sheet electron concentration in the direction of thickness by etching InAs thin film uniformly doped with Si

| Film Thickness* ($\mu$m) | Electron Mobility (cm$^2$/Vs) | Electron Concentration (10$^{16}$ cm$^{-3}$) | Sheet electron Concentration (10$^{12}$ cm$^{-2}$) |
| --- | --- | --- | --- |
| 0.60 | 16,000 | 10.5 | 6.30 |
| 0.50 | 15,000 | 10.4 | 5.20 |
| 0.40 | 14,000 | 10.4 | 4.16 |
| 0.32 | 12,000 | 10.3 | 3.30 |
| 0.20 | 8,500 | 10.3 | 2.06 |
| 0.12 | 3,000 | 10.3 | 1.24 |
| 0.08 | 1,000 | 10.2 | 0.82 |

Note: *Film thickness is calculated from etching rate.

Table 5 shows results of measurement on distribution of characteristics in the direction of thickness formed by etching an undoped InAs thin film having a thickness of 0.50 $\mu$m similar to the Si-doped InAs thin film as shown in Table 4. From Table 5, it can be seen that the sheet electron concentration is almost constant even when the film thickness is reduced by etching but the electron concentration is increased as film thickness is decreased by etching. These data suggest that in undoped InAs films, most of electrons are present in the layer which is closer to the interface with the substrate. That is, in undoped InAs thin films, carriers contributing to electric conduction exist in only the layer with a lower electron mobility. In a layer which is remote from the interface with the substrate and has a high electron mobility, almost no carrier is present. Therefore, this layer contributes a negligibly small amount to electric conduction.

TABLE 5

Distribution of electron mobility, electron concentration and sheet electron concentration in the direction of thickness by etching of undoped InAs thin film

| Film Thickness* ($\mu$m) | Electron Mobility (cm$^2$/Vs) | Electron Concentration (10$^{16}$ cm$^{-3}$) | Sheet electron Concentration (10$^{12}$ cm$^{-2}$) |
| --- | --- | --- | --- |
| 0.50 | 8,500 | 5.3 | 2.65 |
| 0.40 | 7,900 | 7.1 | 2.84 |
| 0.30 | 6,400 | 9.5 | 2.85 |
| 0.20 | 4,500 | 12.6 | 2.52 |
| 0.10 | 2,600 | 32.1 | 3.21 |

Note: *Film thickness was calculated from etching rate.

InAs thin films have a distribution of electron mobility which varies greatly in the direction of the thickness. This distribution is of a two-layer structure having a portion near the interface with substrate in which electron mobility is low (referred to as "layer A") and a portion remote from interface with the substrate in which electron mobility is high (referred to as "layer B"). In InAs thin films of such a two-layer structure, values of electron mobility actually measured are those obtained by synthesis of the results of the layers A and B. Table 6 shows values of electron mobility of the high electron mobility portion (layer B) obtained from the found values when the low electron mobility portion (layer A) has a thickness of 0.1 $\mu$m from the interface and an electron mobility of 3,000 cm$^2$/v·sec and where we assume the other portion remote from the interface is layer B. From the results shown in Table 6, it is revealed that the electron mobility of the layer B is much higher than that of the layer A.

TABLE 6

Electron mobility of high electron mobility portion (layer B) obtained from measured values on Si-doped InAs thin film

| Film Thickness ($\mu$m) | Electron Mobility (cm$^2$/Vs) | | |
| --- | --- | --- | --- |
| | measured | Layer A (assumed) | Layer B* (calculated) |
| 0.1 | 3,000 | 3,000 | — |
| 0.2 | 8,500 | 3,000 | 10,000 |
| 0.4 | 14,000 | 3,000 | 14,300 |
| 0.7 | 17,000 | 3,000 | 17,100 |
| 1.4 | 20,000 | 3,000 | 20,000 |

Note: *Electron mobility of the layer B when the layer A had a film thickness of 0.1 $\mu$m, and an electron mobility of 3,000 cm$^2$/Vs was obtained assuming that electron mobility was constant in each layer.

In the two-layer InAs thin film fabricated by the present inventors, number of electrons which run in the layer B has increased greatly as compared with the undoped InAs thin film because of doping of a donor impurity in the layer B, and accordingly, electric conduction occurs mainly in this layer B. As a result, the electron mobility of the InAs thin film increases and temperature dependence of electron mobility is reduced much. In other words, in the two-layer InAs thin films, the layer B makes a greater contribution to Hall effect.

The temperature-dependent change in the electron mobility of the InAs thin film of the present invention as illustrated in FIG. 4 is coupled with improvement of the temperature-dependent change in the resistivity of the InAs thin film as explained by the following equations.

Assuming that $\rho$ is resistivity of the InAs thin film, e is charge of electron, n is concentration of electron, and $\mu_H$ is Hall mobility of electron, then from the formula $1/\rho = |e| n \mu_H$, the temperature coefficient $\beta\rho$ of resistivity $\rho$ can be expressed by the following formula:

$$\beta\rho = (1/\rho)(d\rho/dT) \quad (1)$$
$$= -(1/n)(dn/dT) + (-1/\mu_H)(d\mu_H/dT)$$

where T denotes the temperature. To obtain the smaller value of the temperature-dependent change in resistivity for all temperature, i.e.

$$\beta\rho \approx 0, \left|\frac{1}{n}\frac{dn}{dT}\right| \text{ and } \left|\frac{1}{\mu_H}\frac{d\mu_H}{dt}\right|$$

must be reduced to negligible values. In the temperature, by increasing the electron concentration n sufficiently large, the contribution of the 1st term could be reduced to negligibly small value in eq. (1), because value of $$\frac{dn}{dT}$$

varies not so much with increasing n. In other words, if n is large enough, this term has no contribution to the temperature-dependent change in resistivity. This situation is realized when the electron concentration n is made high by doping a donor impurity.

In this case, there exists a relation given by $$\beta\rho = (1/\rho)(d\rho/dT) \quad (2)$$
$$\approx (-1/\mu_H)(d\mu_H/dT)$$

where we assumed that n is large enough. Hence $\beta\rho \approx -\beta\mu_H$. That is, the temperature-dependent change in $\beta\rho$ is dominated by $\beta\mu_H$. But, as shown in FIG. 4, the electron mobility of the undoped InAs thin film is gradually increased as temperature increases above the 60° C. Therefore, $\beta\mu_H$ or the temperature-dependent change in electron mobility is not negligible at high temperature exceeding 100° C. or higher as shown in undoped curve in FIG. 4. In order to reduce the temperature-dependent change in resistivity, it is required to reduce the temperature-dependent change and make it negative in electron mobility at high temperatures. Therefore, it is necessary that $\beta\mu_H \lesssim 0$ in order to obtain $\beta\rho \gtrless 0$.

Figure 3:
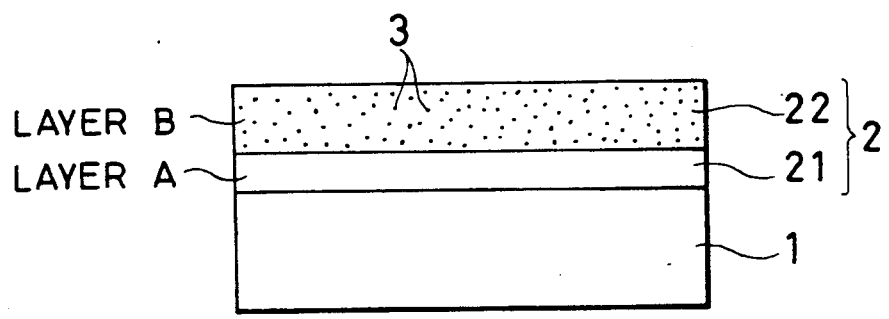
FIG. 3 is a cross-sectional view showing an InAs thin film having a two-layer structure with different electron mobilities, i.e., a lower electron mobility portion 21 (layer A) closer to the interface with the substrate and a higher electron mobility portion 22 (layer B) more remote from the interface with the substrate.

By doping the donor impurity into the InAs thin film, an InAs thin film having a two-layer structure shown in FIG. 3 and this InAs thin film shows the negative and small $\beta\mu_H$ value. By eq (2), temperature coefficient of resistivity $\beta\rho$ is reduced to nearly zero as value of n increases. The InAs thin film having a two-layer structure according to the present invention shown in FIG. 3 where layer B is doped by donor impurity, realized these as illustrated in FIG. 4.

Figure 5:
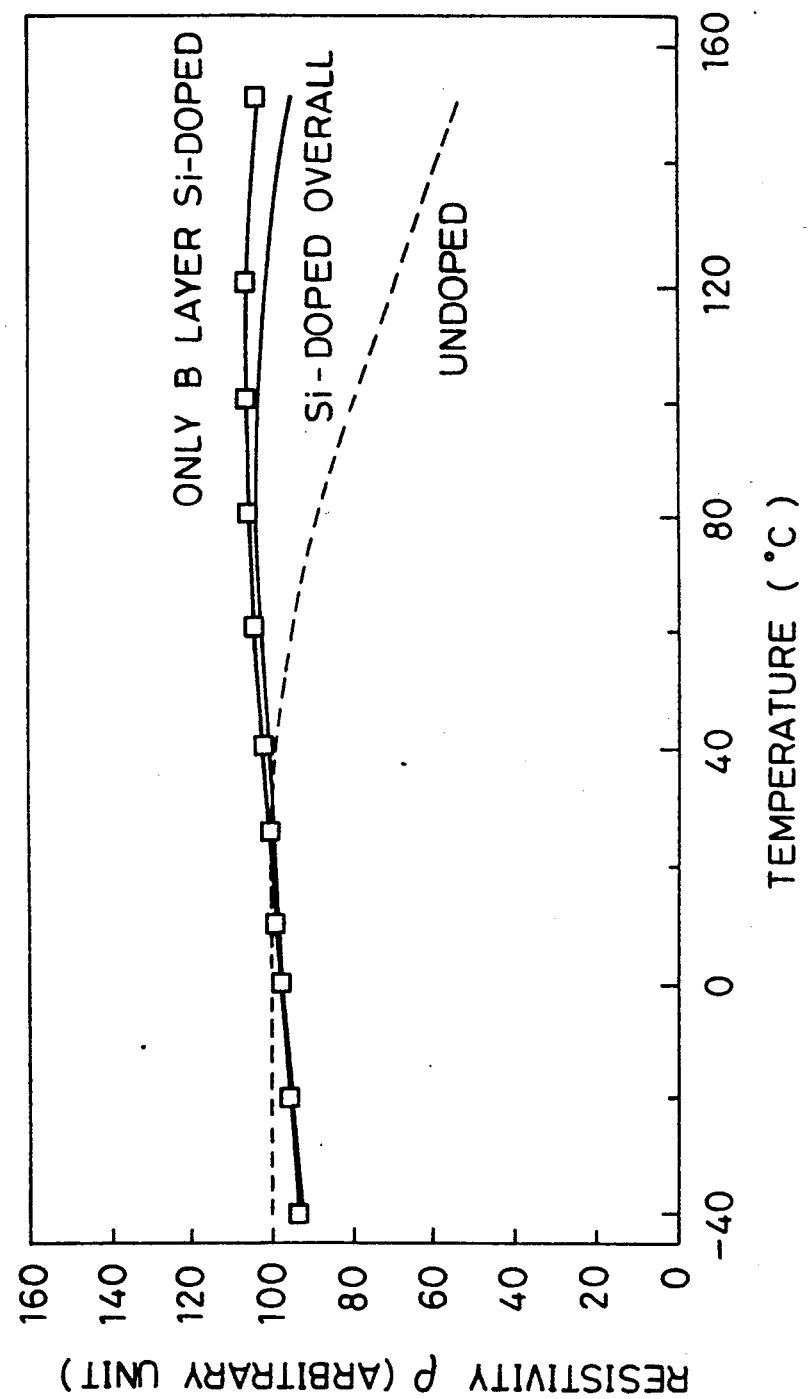
FIG. 5 is a graph illustrating the temperature dependence of resistivity of the InAs thin films used in the present invention.

FIG. 5 illustrates temperature-dependent change in the resistivity of an InAs thin film. FIG. 5 indicates that Si doping reduces the temperature-dependent change in resistivity greatly. This effect has been realized by the improvement of the temperature characteristics of electron mobility illustrated in FIG. 4.

Also, FIG. 5 indicates that there is observed no difference in the manner of the temperature-dependent change in resistivity regardless of whether doping was carried out only in the high electron mobility portion or uniform doping was performed over the entire thin film. Hence, it is revealed that doping to increase carriers in the high electron mobility portion of the InAs thin film can reduce the temperature-dependent change in resistivity remarkably.

Since the behavior of the temperature-dependent change in electron mobility at 40° to 150° C. changes drastically by doping a donor impurity, the temperature coefficient $\beta\rho$ of resistivity which is dependent on the temperature-dependent change in the electron concentration and the temperature-dependent change in the electron mobility in the InAs thin film can be made smaller. As compared with undoped InAs thin films, the doped ones indicate a reduced temperature-dependent change in resistivity at higher temperature regions. In addition, the resistivity is substantially constant up to a high temperature as high as 150° C. As a result, the temperature coefficient of resistivity of the InAs thin film is made positive or nearly zero over a wide range from a low temperature to a high temperatures. In other words, it has been successful to make the temperature-dependent change in the resistivity of an InAs thin film having a thickness of 1.4 μm or less substantially zero or a negligibly small value.

Figure 6:
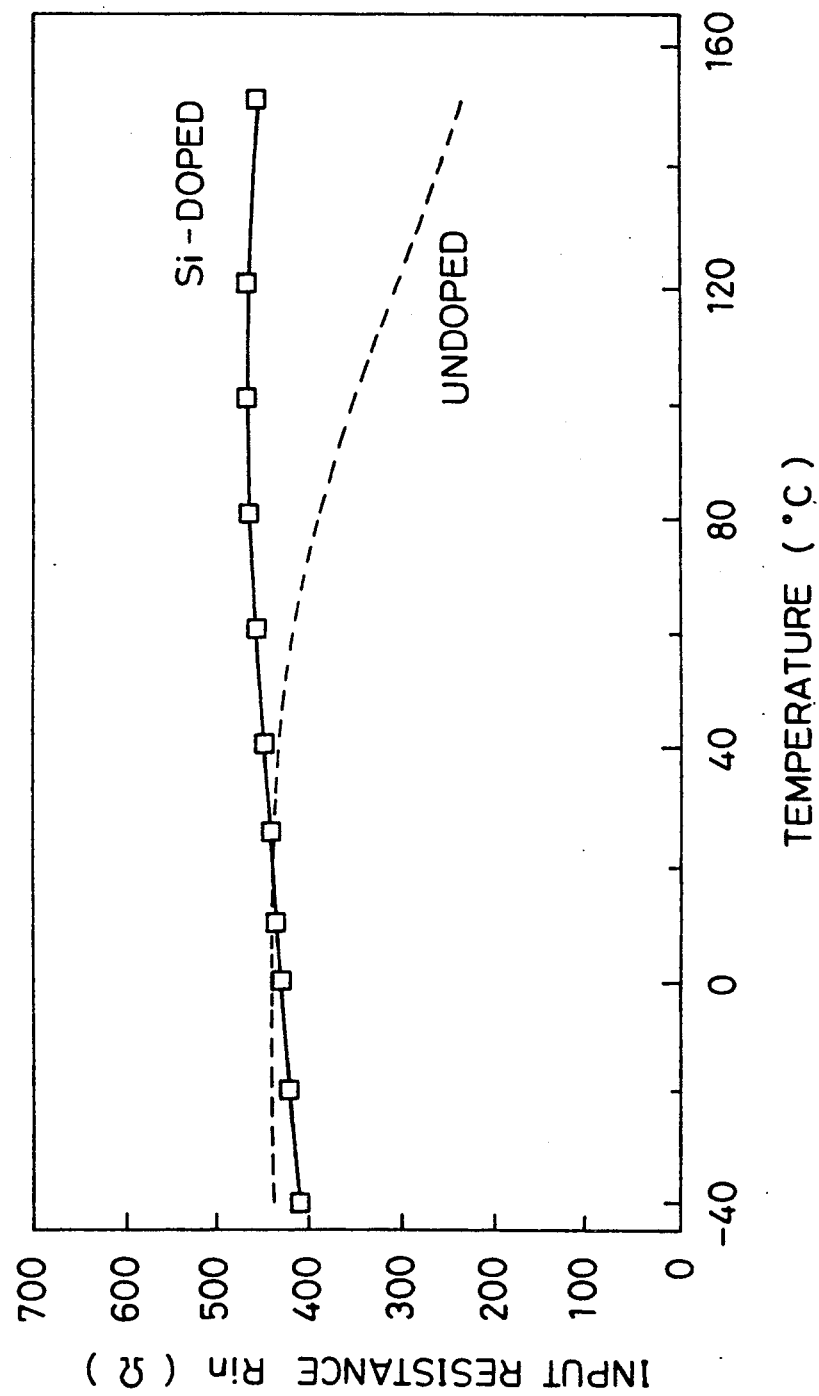
FIG. 6 is a graph illustrating the temperature dependence of input resistance of the InAs Hall elements of the present invention.

As described above, the present inventors have made an InAs thin film having a two-layer structure and attained a high electron mobility, and also produced a Hall element using this thin film. That is, the present inventors have produced an InAs thin film having layer A which has a low electron mobility and layer B which has a high electron mobility and a high electron concentration by doping, and then produced a Hall element using the InAs thin film thus obtained. The InAs Hall element of the present invention using this thin film indicates negligibly small or nearly zero temperature coefficient in resistance without decrease in resistance at a high temperature as illustrated in FIG. 6.

Based on these, the present inventors have realized an InAs Hall element which indicates nearly zero temperature coefficient in input resistance dependent on temperature over a temperature range of from 40° C. to 150° C. by using an InAs thin film having two layers different in electron mobility being formed on a substrate by epitaxial growth to a thickness of 0.2 to 1.4 μm. The InAs thin film thus includes a higher electron mobility layer and a lower electron mobility layer, the higher electron mobility layer being doped with donor impurities.

As a result, the InAs Hall element of the present invention is free of a phenomenon that input resistance decreases accordingly as the temperature increases above 60° C., thus overcoming the difficult problem in constant voltage driving. Further, it is revealed that even when small size Hall element chip is made, input resistance, does not decrease with increase in temperature hence, electric current does not increase, resulting in that power consumption does not increase, thus causing no excessive heat generation. Then, the stable constant voltage driving is possible for the Hall element at high temperatures. This not only improves the reliability of InAs Hall elements with high sensitivity but also makes it possible to increase maximum driving voltage (maximum rating) and, hence, obtain a large Hall output voltage. As a result, it is successful to improve practical characteristics of InAs Hall elements considerably.

Hereinafter, the present invention will be described in greater detail by way of example. However, the present invention is not restricted thereto.

EXAMPLE

Figure 1A:
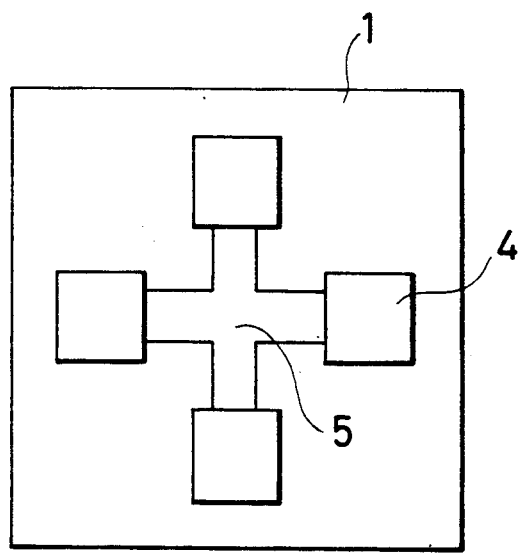
FIG. 1A is a plan view showing a Hall element (chip) having as a magneto-sensitive portion an InAs thin film having a two-layer structure according to the present invention.
Figure 1B:
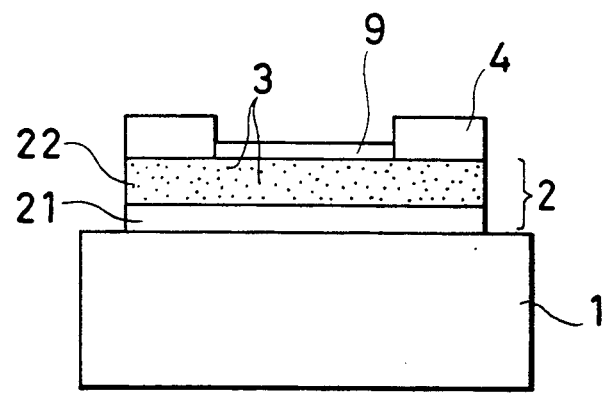
FIG. 1B is a cross-sectional view showing the Hall element (chip) shown in FIG. 1A.
Figure 2A:
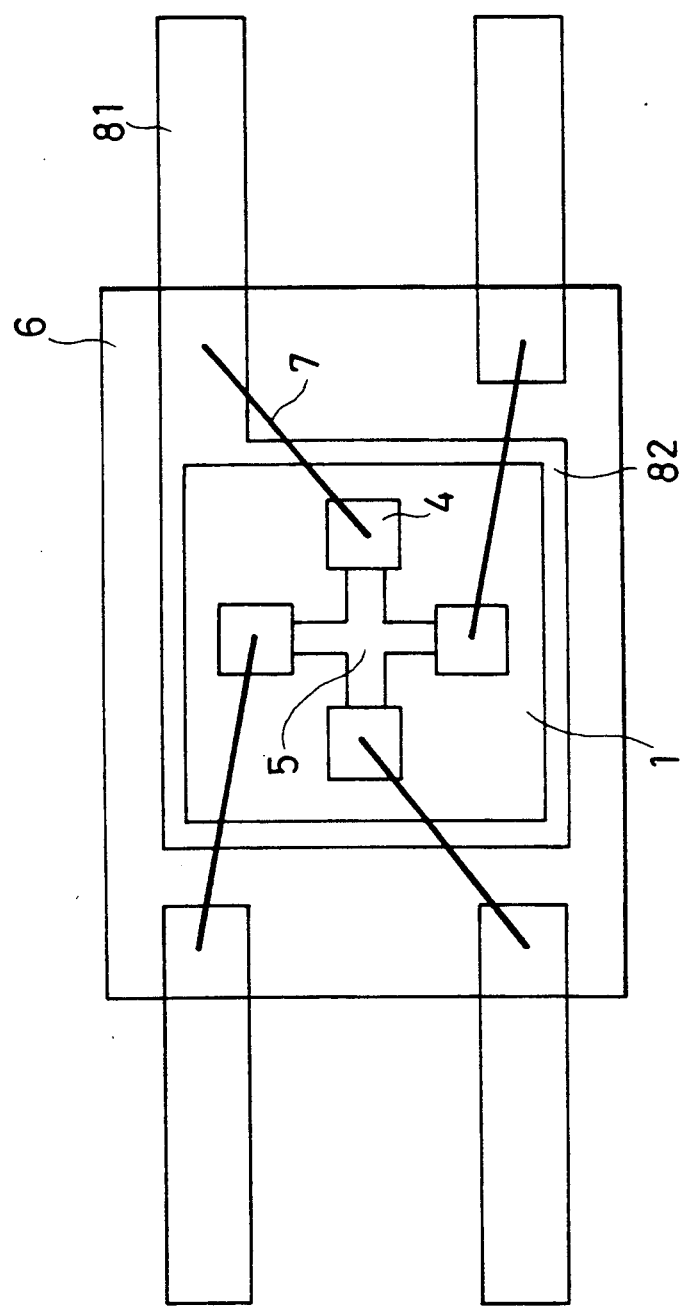
FIG. 2A is a plan view showing a Hall element of the present invention, in which the Hall element (chip) shown in FIGS. 1A and 1B is disposed on an island portion of a lead, wired with a gold wire and packaged.
Figure 2B:
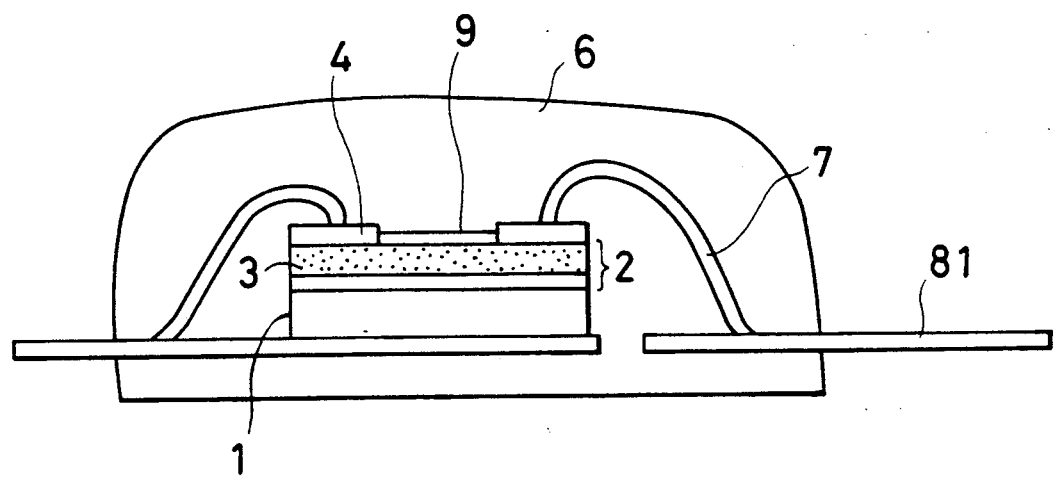
FIG. 2B is a cross-sectional view showing the Hall element shown in FIG. 2A.

FIG. 3 shows an InAs thin film having a two-layer structure with different electron mobilities, i.e., a lower electron mobility portion (layer A) closer to the interface with the substrate and a higher electron mobility portion (layer B) more remote from the interface with the substrate. In FIG. 3, reference numeral 1 denotes a substrate. Reference numeral 2 denotes an InAs thin film, which is of a two-layer structure. Reference numeral 21 denote a layer A having a lower electron mobility and 22, a layer B having a higher electron mobility. Further, reference numeral 3 denotes a donor impurity, which is doped to the layer B having a higher electron mobility. FIGS. 1A and 1B, respectively show the structure of a Hall element having the InAs thin film having layer structure as a magneto-sensitive portion according to the present invention. FIG. 1A is a top view and FIG. 1B a cross-sectional view. Reference numeral 4 denotes an electrode of the Hall element. Reference numeral 5 denotes a magneto-sensitive portion of the Hall element. FIGS. 2A and 2B show an example of packaged Hall element in which the Hall element is disposed on the island portion of a lead, wired with a gold wire and packaged. FIG. 2A is a plan view, and FIG. 2B a cross-sectional view. Reference numeral 6 denotes an epoxy resin as molding material for packaging. Reference numeral 7 denotes an Au wire. Reference numerals 81 and 82 denote a lead, and an island portion of a lead. Reference numeral 9 denotes a protective layer as a passivation layer on the surface of InAs.

As for the donor impurity element which takes an important role in the present invention, there can be used favorably those which serve generally as a donor impurity for InAs and include, for example, Si, S, Ge, Se, Sn, and the like. The amount of doping must be at least $4 \times 10^{16}/cm^3$ as electron concentration. Because there is a limitation in the amount of doping for each element, the upper limitation of the electron concentration is $8 \times 10^{17}/cm^3$. In the thin film having a thickness of 1.4 μm or less, which is favorably used in Hall elements, Si, S, Ge and Sn are particularly preferred elements as a dopant.

The layer A may be doped with a donor impurity in an amount within the range where its contribution to electric conduction is negligible as compared with the layer B. It is preferred that the concentration of donor impurity to the layer A be lower or the same as in the layer B.

The substrate used in the present invention may be of any type so far as it is insulating or semi-insulating substrate which allows epitaxial growth of an InAs thin film thereon. Among them, particularly preferred are semi-insulating substrate composed of GaAs or InP. Further, substrate obtained by hetero-epitaxial growth of GaAs, InP and the like on Si substrate or the like can be used preferably as a substrate in the present invention. Here, the term "epitaxial growth" used in the present invention is meant that a thin film is grown on a substrate in accordance with the regularity of the crystal structure in the substrate.

Sheet resistance is determined to be about 50Ω in its lower limit in view of practically usable range of Hall element design. Upper value of input resistance of InAs Hall elements is not restricted, but usually, the value of 1KΩ or less is good for application. In the InAs Hall element application, it is preferred that the sheet resistance of the InAs thin film be 600Ω or less, and more preferably, 400Ω or less.

FIG. 6 shows the temperature dependence of input resistance of the InAs thin film Hall element corresponding to the temperature dependence of the resistivity of the InAs thin film shown in FIG. 5, and shows much reduction in the temperature-dependent change. Here, solid line indicates temperature dependence of the input resistance of the InAs Hall element of the present invention, and broken line indicates temperature dependence of the input resistance of the undoped InAs Hall element. The temperature coefficient of the input resistance of the InAs thin film Hall element is very small at 100° C. or higher. This reflects the temperature-dependent change in $\mu_H$ of the InAs thin film having a two-layer structure as shown in FIGS. 3 and 4.

Figure 7A:
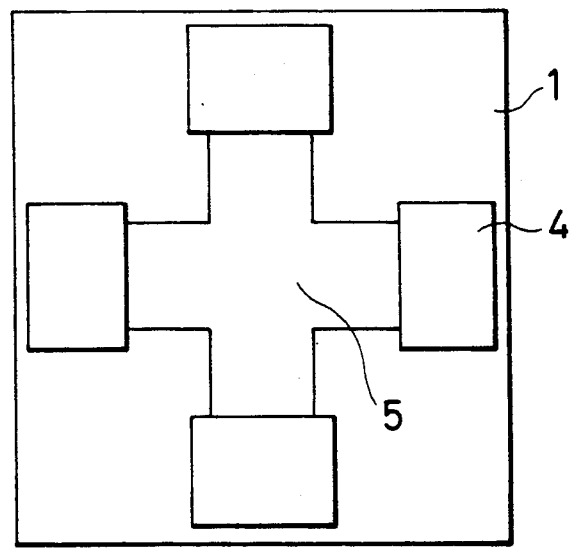
FIG. 7A is a plan view showing a Hall element (chip) of the present invention, in which the ferromagnetic material is arranged on the lower side of the substrate.
Figure 7B:
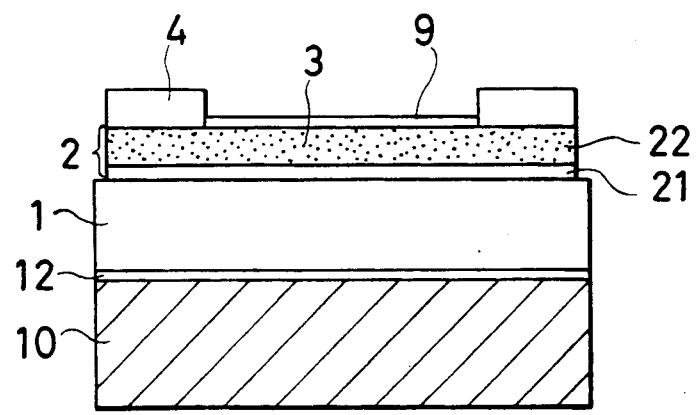
FIG. 7B is a cross-sectional view showing the Hall element (chip) shown in FIG. 7A.
Figure 8:
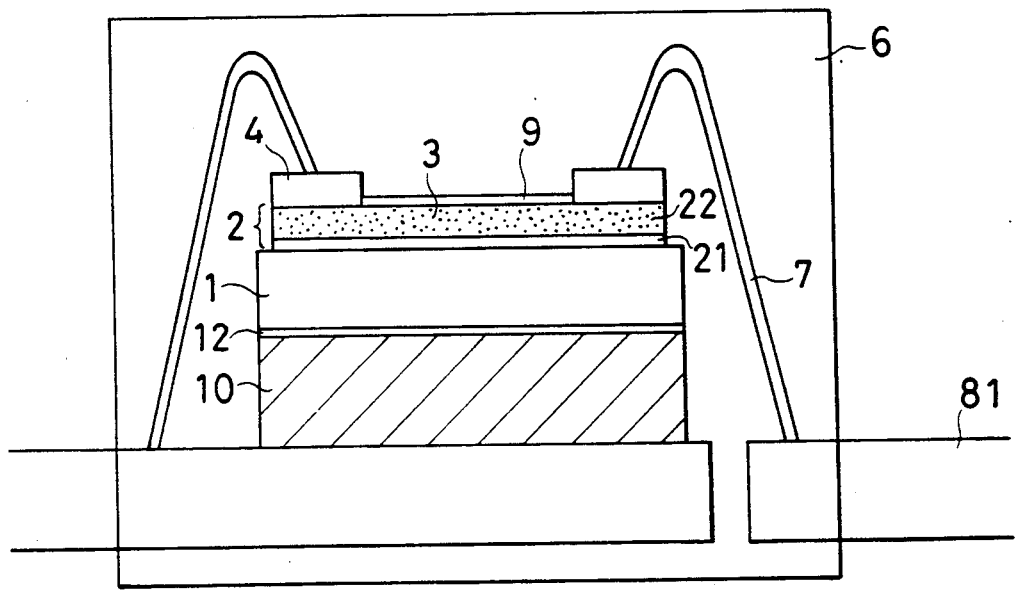
FIG. 8 is a cross-sectional view showing a Hall element of the present invention, in which the Hall element (chip) shown in FIGS. 7A and 7B is disposed on an island portion of a lead, wired with a gold wire and packaged.
Figure 9:
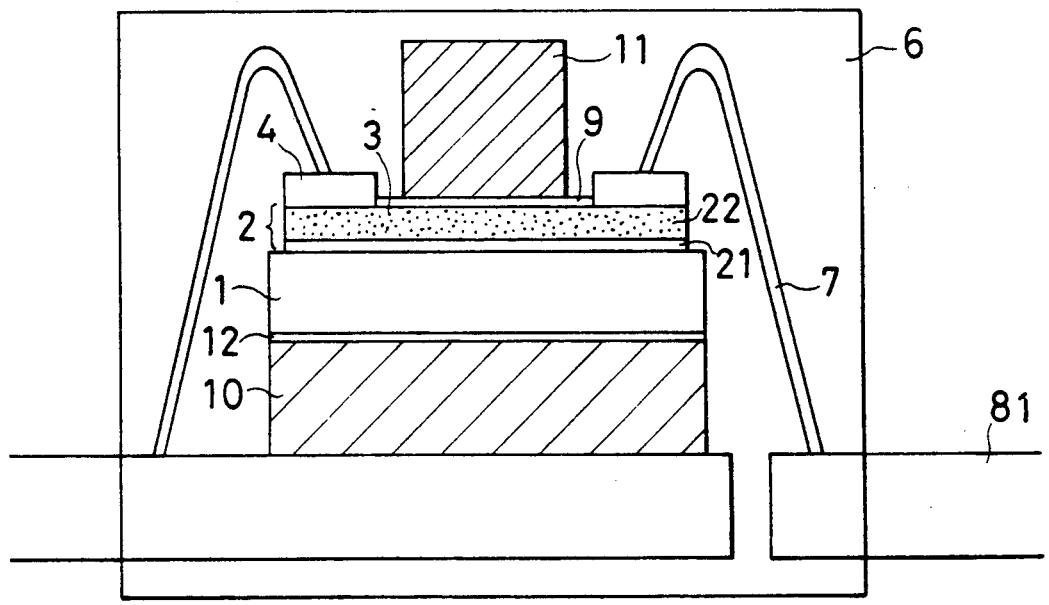
FIG. 9 is a cross-sectional view showing a Hall element of the present invention, in which the Hall element (chip) provided with a body of a ferromagnetic material both on the lower side of the substrate and on the upper side of the InAs thin film is disposed on an island portion of a lead, wired with a gold wire and packaged.
Figure 10:
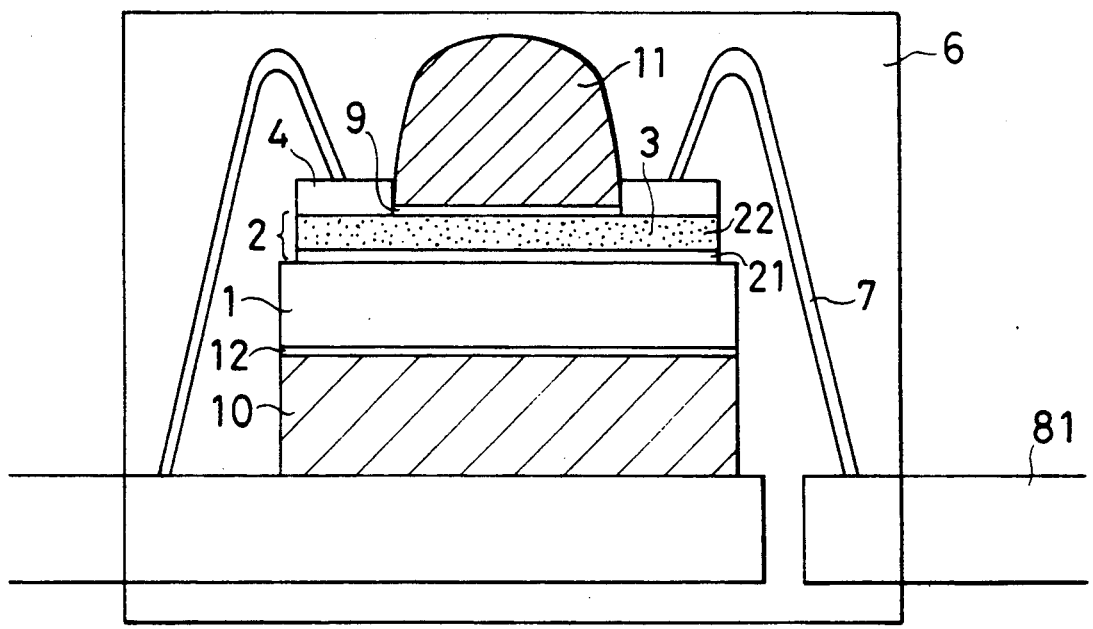
FIG. 10 is a cross-sectional view showing a Hall element of the present invention, in which the Hall element (chip) provided with a cluster of resin containing ferromagnetic material powder instead of a body of a ferromagnetic material on the upper side of the InAs thin film shown in FIG. 9 is disposed on an island portion of a lead, wired with a gold wire and packaged.
Figure 11:
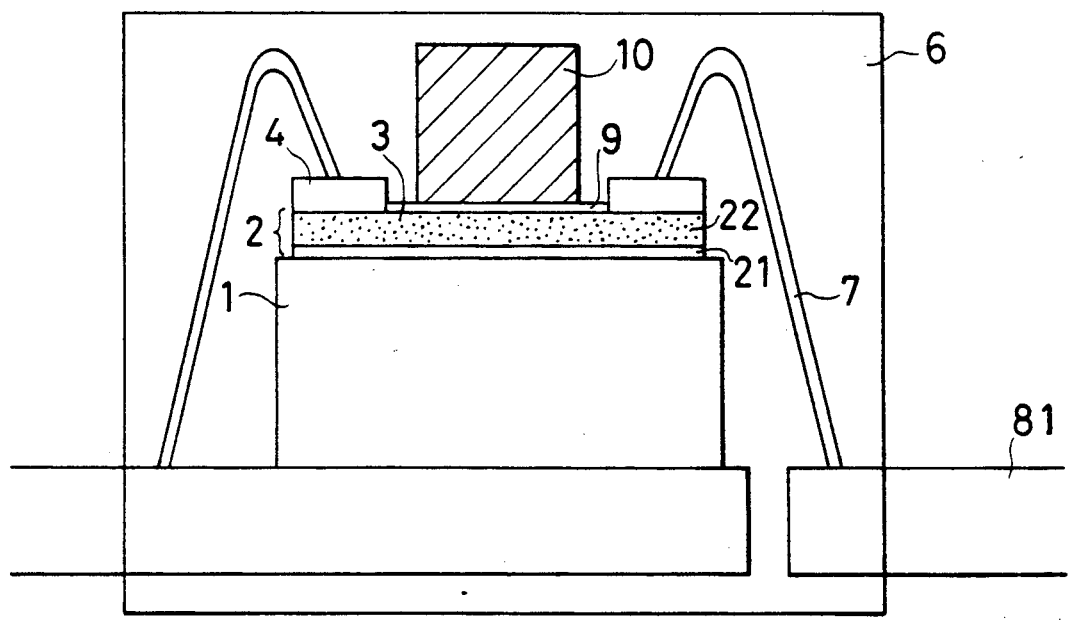
FIG. 11 is a cross-sectional view showing a Hall element of the present invention, in which the Hall element (chip) provided with a body of a ferromagnetic material on the upper side of the InAs thin film is disposed on an island portion of a lead, wired with a gold wire and packaged.

The Hall element of the present invention may preferably have a magnetic amplifying structure in order to obtain large Hall output voltage. As an example of such a structure, FIGS. 7A and 7B show an example of Hall element with the magnetic amplifying structure according to the present invention. FIG. 7A is a top view of the structure of Hall element of the present invention and FIG. 7B is a cross-sectional view thereof. Reference numeral 10 denotes a ferromagnetic material arranged in order to give a magnetic amplifying effect. FIG. 8 shows an example of packaged element, in which the Hall element shown in FIGS. 7A and 7B is disposed on the island portion of a lead, wired with a gold wire and packaged. In this example, the ferromagnetic material 10 used in order to endow the Hall element with a magnetic amplifying effect may be generally any material that has a high permeability and less residual magnetization. Ferrite, Permalloy and the like can be used preferably as the ferromagnetic material. Material obtained by mixing powder of ferrite, Permalloy or the like with a resin such as epoxy resin or silicone resin and curing the mixture, can be used frequently as the ferromagnetic material too. As shown in FIG. 9, the magneto-sensitive portion may be sandwiched by the first ferromagnetic material 10 and the second ferromagnetic material 11 in order to increase the magnetic amplifying effect. The ferromagnetic material is arranged close to the magneto-sensitive portion in order to obtain large magnetic amplifying effect. FIGS. 10 and 11 show another production examples having a magnetic amplifying structure.

Figure 12A:
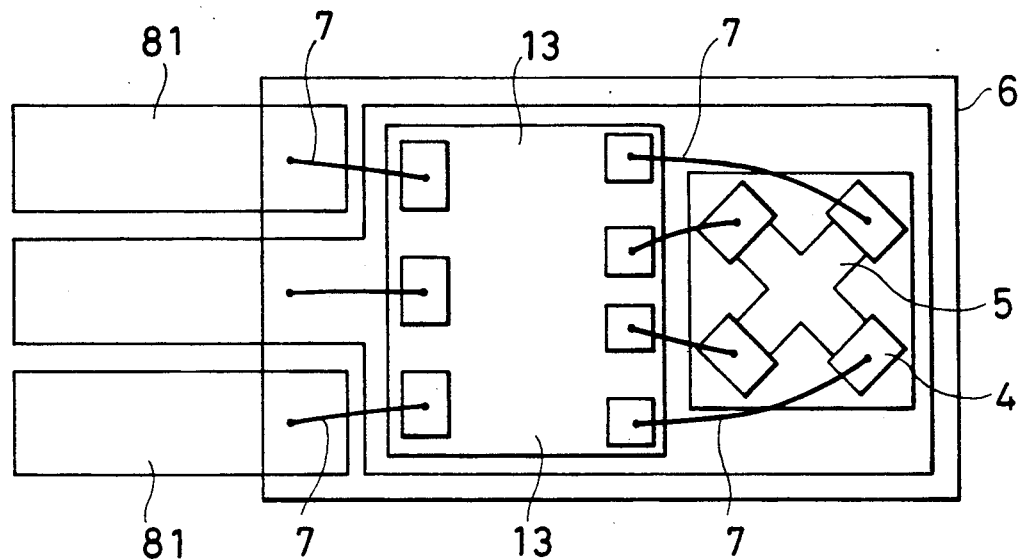
FIG. 12A is a plan view showing a magnetoelectric transducing device of the present invention, in which the Hall element and the circuit element are formed in the same package.
Figure 12B:
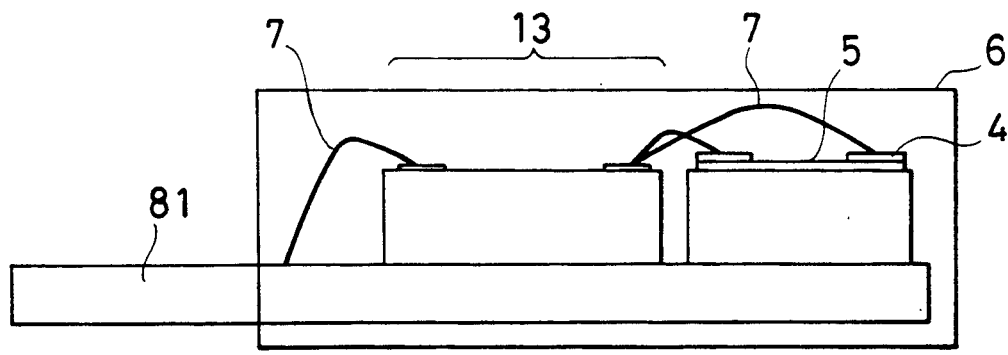
FIG. 12B is a cross-sectional view showing the device shown in FIG. 12A.

The Hall element of the present invention may often be integrated with other circuit elements. FIG. 12 shows an example of InAs magnetoelectric transducing device which includes therein the InAs Hall element of the present invention and other circuit elements.

Figure 13:
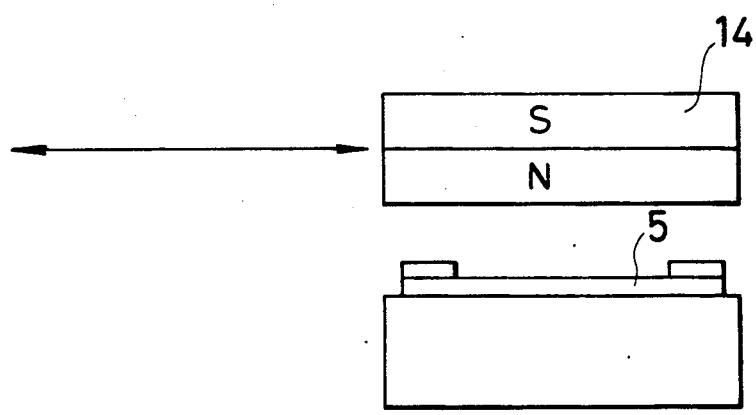
FIG. 13 is a schematic diagram showing a magnetic switch having means for applying a magnetic field to generate a Hall output voltage of the InAs Hall element according to the present invention.

FIG. 13 shows a magnetic switch having means for applying a magnetic field to generate a Hall output voltage of the InAs Hall element according to the present invention. By assembling a Hall element and a means for applying a magnetic field, it is possible to fabricate a magnetic switch by generating Hall output voltage as a signal for switching a current or producing the transition from high level signal to low level signal or reverse mode changing magnetic field intensity by the means for applying magnetic field. An example of this is an assembly of with the Hall element and a piece of magnet which has the mechanism to change the applying of magnetic field to the Hall element. Thus, the present invention embraces an embodiment including means for applying a magnetic field.

Next, the process for producing the Hall element of the present invention includes the steps of forming an InAs thin film to a thickness of 0.2 to 1.4 μm on an insulating substrate by epitaxial growth, doping a higher electron mobility layer of the InAs thin film with a donor impurity, then forming electrodes on predetermined portions of the InAs thin film, and forming a pattern of a magneto-sensitive portion by etching.

The step of forming an InAs thin film to a thickness of, for example, 0.2 to 1.4 μm on an insulating substrate by epitaxial growth is hoped to obtain an InAs thin film having a good quality of crystal on a substrate by epitaxial growth. Therefore, the epitaxial growth may be carried out by any of molecular beam epitaxy method or MBE method, metal organic chemical vapor deposition method or MOCVD method, liquid phase epitaxy method or LPE method, vapor phase epitaxy method or VPE method and the like.

The step of doping a donor impurity into a higher electron mobility layer of the InAs thin film may be carried out by the methods used for impurity doping to thin film such as in situ doping at thin film growth, ion implantation method, thermal diffusion method or the like. The in situ doping at thin film growth is preferably used for our purpose. Thus, it is particularly preferred to simultaneously perform doping of a donor impurity into the higher electron mobility layer of the InAs thin film during the step of forming, by epitaxial growth, the InAs thin film having a thickness of 0.2 to 1.4 μm. Particularly, it is preferred to do the in situ doping at thin film growth by MBE method or MOCVD method which is excellent in controlling the doping.

The step of forming the electrodes on predetermined portions of the InAs thin film using electrode metal layer formed on them, may be the process by using evaporation, sputtering, or the like and applying a lift off method with photolithography to form metal layers on the only predetermined portions, or by using evaporation, sputtering, plating or the like to form metal layers all over the surface and removing undesired portion by etching, or by using plating to form the metal layer on the predetermined portion only by using the resist mark by photolithography. In order to realize good bonding property, the structure of the electrode is preferably a laminate structure obtained by laminating a contact layer, a bonding layer or intermediate layers inserted between these layers or the like. A three-layer structure composed of a Cu ohmic contact layer, an Ni intermediate layer and an Au bonding layer is particularly preferred.

The step of forming a pattern of a magneto-sensitive portion by etching is to remove the undesired portion by dry etching or wet etching utilizing the technique of photolithography.

It is often the case that use is made of a step of arranging a ferromagnetic material on at least one side of the magneto-sensitive portion made of the InAs thin film close thereto. Often use is made of a step of arranging a ferromagnetic material on both sides of the magneto-sensitive portion close thereto in order to render more sensitive.

PRODUCTION EXAMPLE 1

A holder having therein a dozen of semi-insulating GaAs substrates of 0.3 mm thick and 2 inches in diameter with one of surfaces of each substrate being mirror surface-finished was set in a growing chamber under ultra high vacuum in a molecular-beam epitaxy apparatus where mirror surface side of GaAs substrate was facing to evaporation sources. Then, the substrate holder was rotated horizontally and the GaAs substrates were heated by a substrate heater. Charged evaporation sources i.e. K-sells by In, As and Si, respectively, were also set up. Next, In and As were evaporated from K cells for 20 minutes under the conditions of a substrate temperature of 580° C., an In cell temperature of 750° C., an As beam of $3 \times 10^{-5}$ mb, and at the same time Si, a dopant, was evaporated for 15 minutes starting after 5 minutes from the initiation of the evaporation under the condition of a cell temperature of 1,140° C. Thus, Si-doped InAs single crystal thin film having a thickness of 0.4 μm was formed by epitaxial growth on the mirror surface side of the substrate as shown in FIG. 3. After cooling it, the substrate was taken out from the molecular-beam epitaxy apparatus and its characteristics were measured. As a result, it had a sheet resistance of 120 Ω and an electron mobility of 14,000 cm$^2$/Vs.

The InAs thin film as shown in FIG. 3 thus produced had a low electron mobility layer in the vicinity of the interface with the GaAs substrate and a high electron mobility layer with Si as a donor impurity remote from the interface with the substrate.

Then, on the surface of the InAs thin film grown on the GaAs substrate, Cu and Ni were sequentially plated to a thickness of each 1 μm by a wet plating method thereon as electrodes by a technique of photolithography. Thereafter, the resist was removed, and then Au layer was plated selectively on the electrodes forming bonding portions by a technique of photolithography. Following these processes, using new resist as a mask, a part of the metallic film formed on the InAs thin film was etched out to form electrodes and at the same time the InAs thin film was etched. Further, a film of Si$_3$N$_4$ to a thickness of 3,000 Å was formed thereon as an insulating layer by plasma CVD method at a substrate temperature of 300° C. A resist pattern was formed thereon by the same photolighographic method as described above to form a resist pattern and the Si$_3$N$_4$ on the electrode portion was removed by reactive ion etching. By these steps, about 8,700 Hall elements as shown in FIGS. 1A and 1B were prepared on a single substrate.

Then, the Hall elements on the substrate were divided into a number of single Hall element chips by using a dicing saw. These Hall element chips were die bonded on an island portion of a lead with an electroconductive epoxy resin using an automatic die bonder, and the electrode portion of the Hall element were connected to the load with an Au wire using an automatic wire bonder. Then, a silicone resin was bonded, dropped and cured on the chip surface of the Hall element to protect it, and molded in an epoxy resin using a transfer molder. The thus molded Hall element was subjected to lead cutting and finished into individual resin molded Hall elements as shown in FIGS. 2A and 2B. Table 7 shows representative characteristics of the thus produced Hall element.

TABLE 7

Representative characteristics of InAs Hall element

| Element No. | Input Resistance (Ω) | Output Resistance (Ω) | Driving at Constant Voltage | | Driving at Constant Current | |
|---|---|---|---|---|---|---|
| | | | Output Voltage (mV) | Offset Voltage (mV) | Output Voltage (mV) | Offset Voltage (mV) |
| 1 | 438 | 441 | 50.5 | +0.7 | 14.7 | +0.1 |
| 2 | 444 | 445 | 50.1 | −0.7 | 14.8 | −0.1 |
| 3 | 438 | 443 | 50.7 | +1.2 | 14.8 | +0.2 |
| 4 | 438 | 438 | 50.6 | +1.2 | 14.7 | +0.2 |
| 5 | 438 | 436 | 50.5 | +0.8 | 14.7 | +0.1 |
| 6 | 437 | 436 | 50.6 | +0.5 | 14.7 | +0.1 |
| 7 | 436 | 436 | 50.8 | +0.9 | 14.8 | +0.1 |
| 8 | 428 | 434 | 51.4 | −0.4 | 14.7 | −0.1 |
| 9 | 427 | 434 | 51.3 | −0.0 | 14.6 | −0.0 |

Notes:
Constant voltage driving was performed at an input voltage of 3 V and a magnetic flux density of 500 G.
Constant current driving was performed at an input current of 1 mA and a magnetic flux density of 1 kG.

Figure 14:
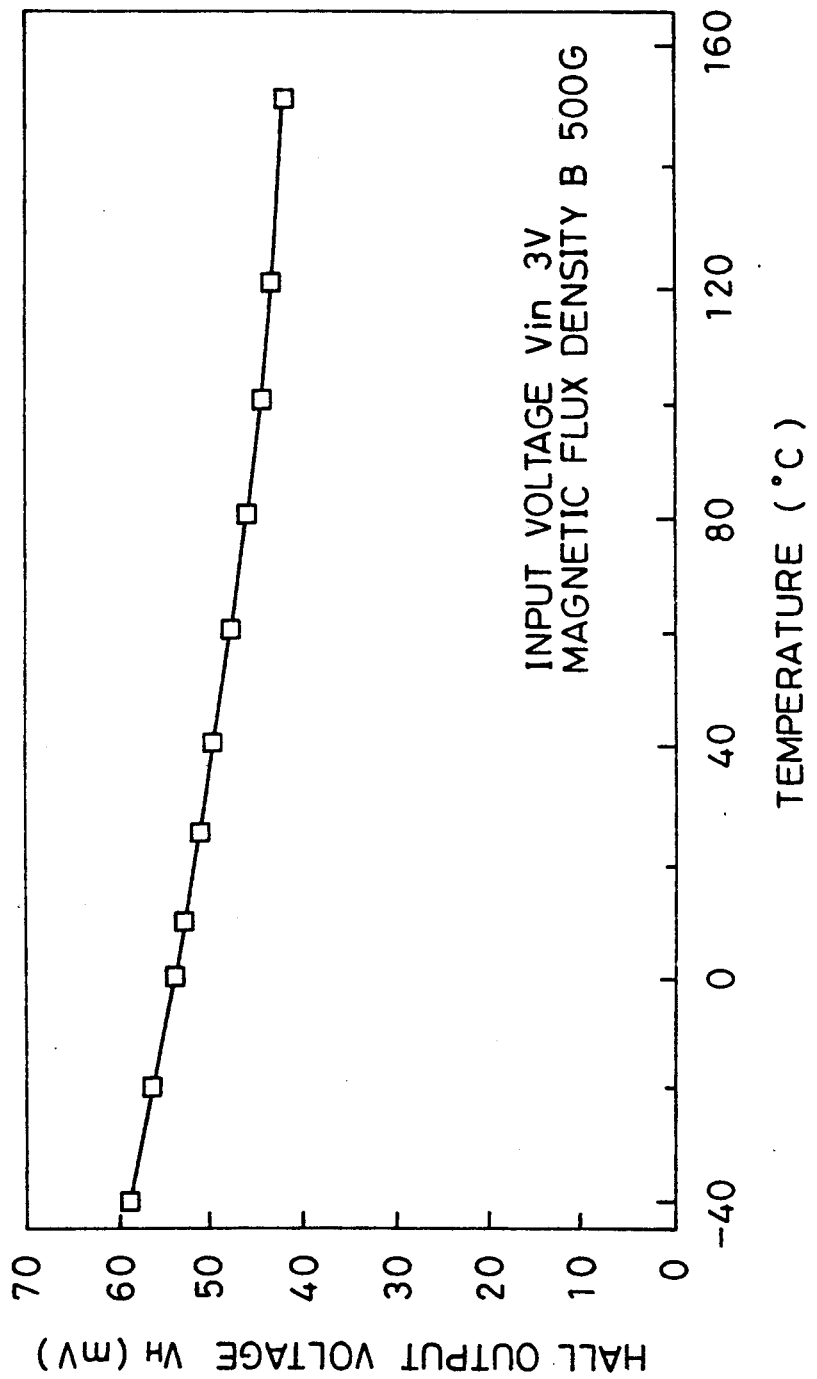
FIG. 14 is a graph illustrating the temperature dependence of Hall output voltage of the InAs Hall element of the present invention at constant voltage driving.
Figure 15:
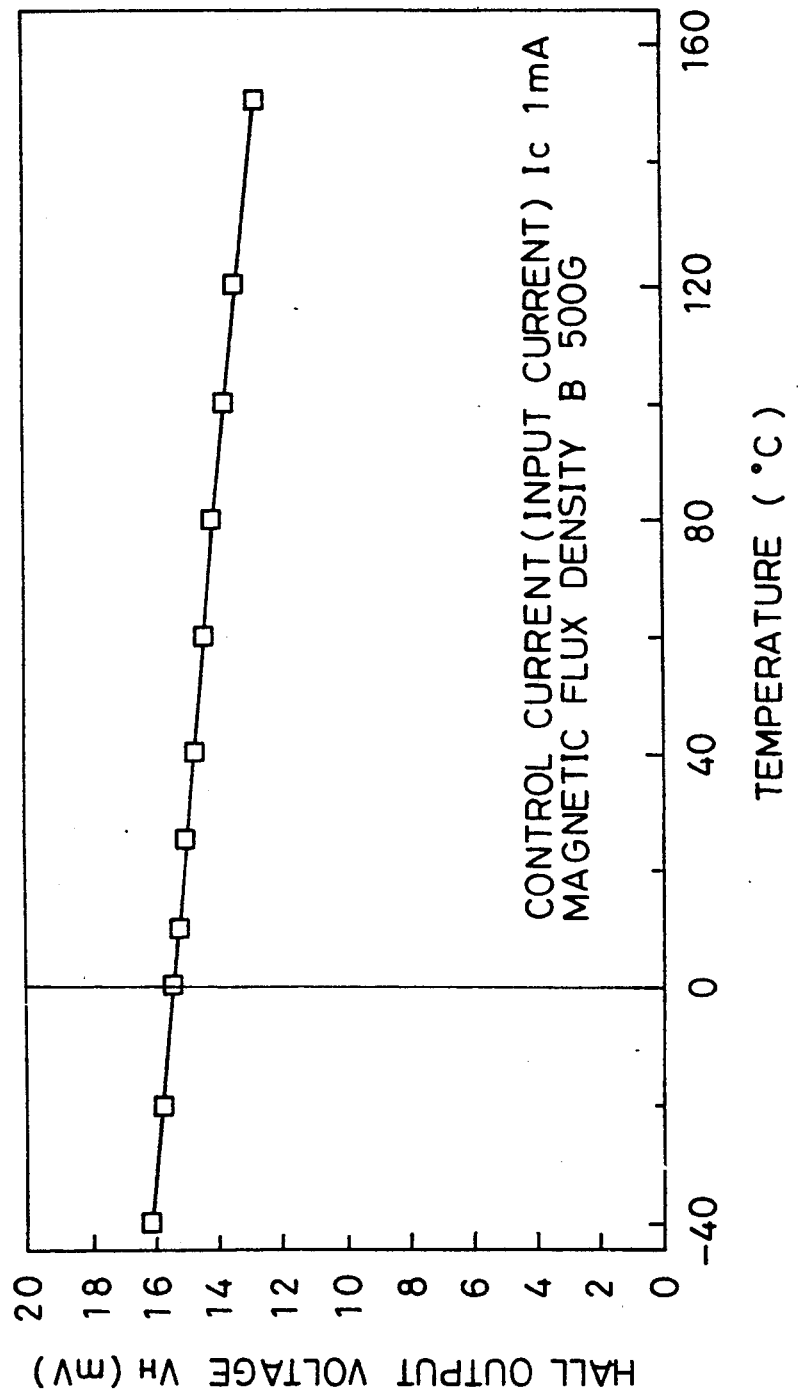
FIG. 15 is a graph illustrating the temperature dependence of Hall output voltage of the InAs Hall element of the present invention at constant current driving.

FIGS. 6, 14 and 15 illustrate the temperature characteristics of the resin molded Hall element. From FIG. 6, it can be seen that the Hall element of the present invention has a temperature dependency of the input resistance (solid line) which does not decrease up to 150° C., which is not observed in the conventional Hall element. It is revealed that the temperature-dependent change in Hall output voltage is very small. The changes are calculated according to the following formula:

(Output Voltage at 150° C.−Output Voltage at 25° C.)/Output Voltage at 25° C./(150° C.−25° C.).

In case that this formula is applied to FIG. 14, the change when driven at a constant voltage is −0.12%/° C. which is calculated from (44 mV−52 mV)/52 mV/125° C. Further, in case that the formula is applied to FIG. 15, the above change when driven at a constant current up to 150° C. is −0.11%/° C. which is calculated from (13 mV−15 mV)/15 mV/125° C.

Further, Table 8 shows results of representative reliance tests of the Hall element thus produced.

TABLE 8

Maximum input voltage of Hall element of same size (comparative data)

| Maximum Input Voltage (V) | |
|---|---|
| Invention | Undoped |
| 13.0 | 8.2 |
| 12.5 | 8.4 |
| 13.1 | 9.0 |
| 13.0 | 7.9 |
| 13.5 | 8.4 |
| 12.9 | 8.2 |

Note: Number of test samples were 6 for doped and undoped samples.

Maximum input voltage at room temperature increased by about 50% as compared with undoped InAs Hall element, which indicates that the element was thermally strengthened to a greater extent. Further, self-breaking type trouble mode at high temperatures disappeared. In addition, because the temperature coefficient in resistance of the InAs Hall element of the invention was small and almost a constant, the temperature-dependent change in offset voltage at zero magnetic field became very small as compared with un-doped InAs Hall element.

Figure 16:
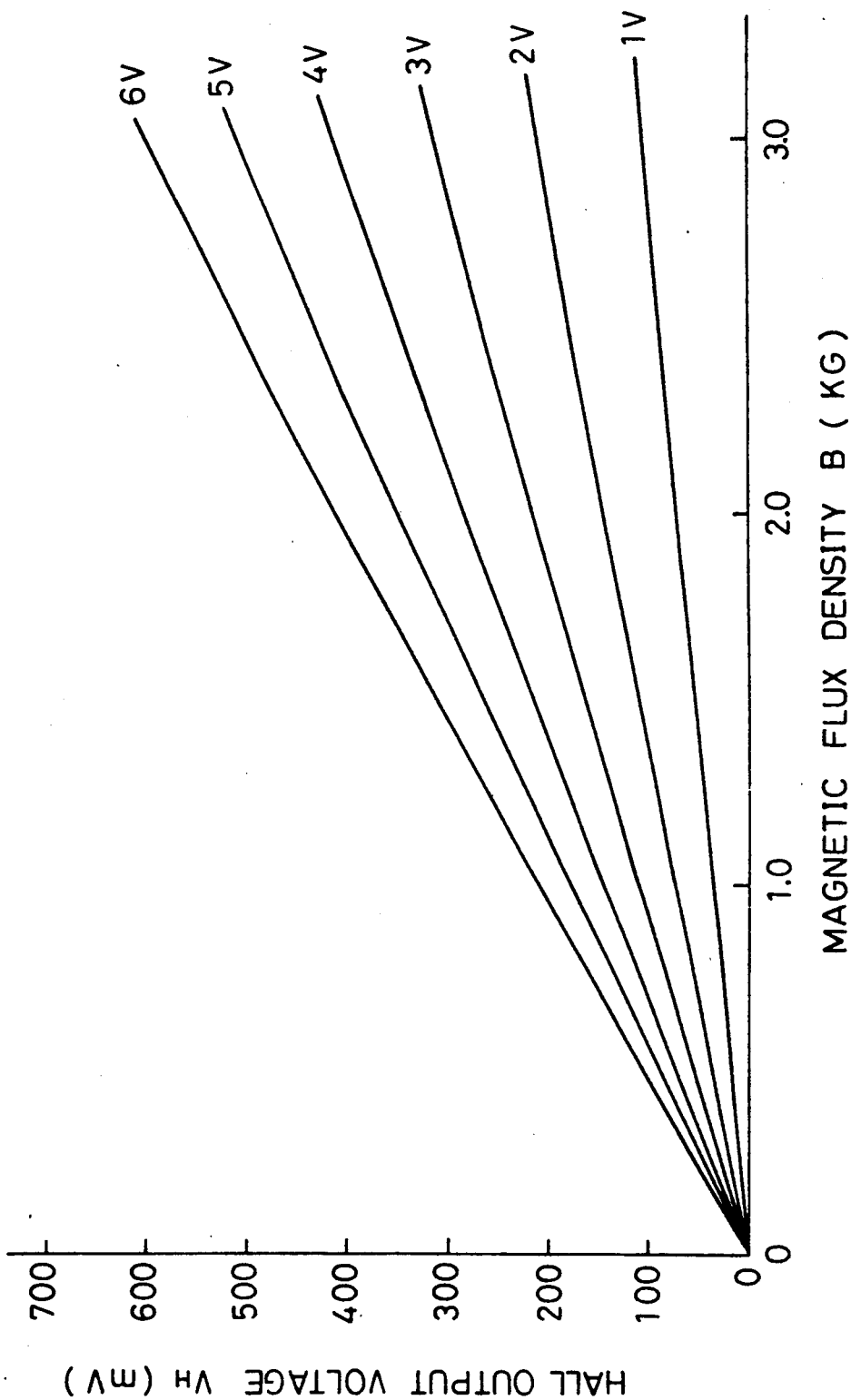
FIG. 16 is a graph illustrating magnetic field dependence of the Hall output voltage ($V_H$-B characteristics) of the InAs Hall element of the present invention at constant voltage driving.
Figure 17:
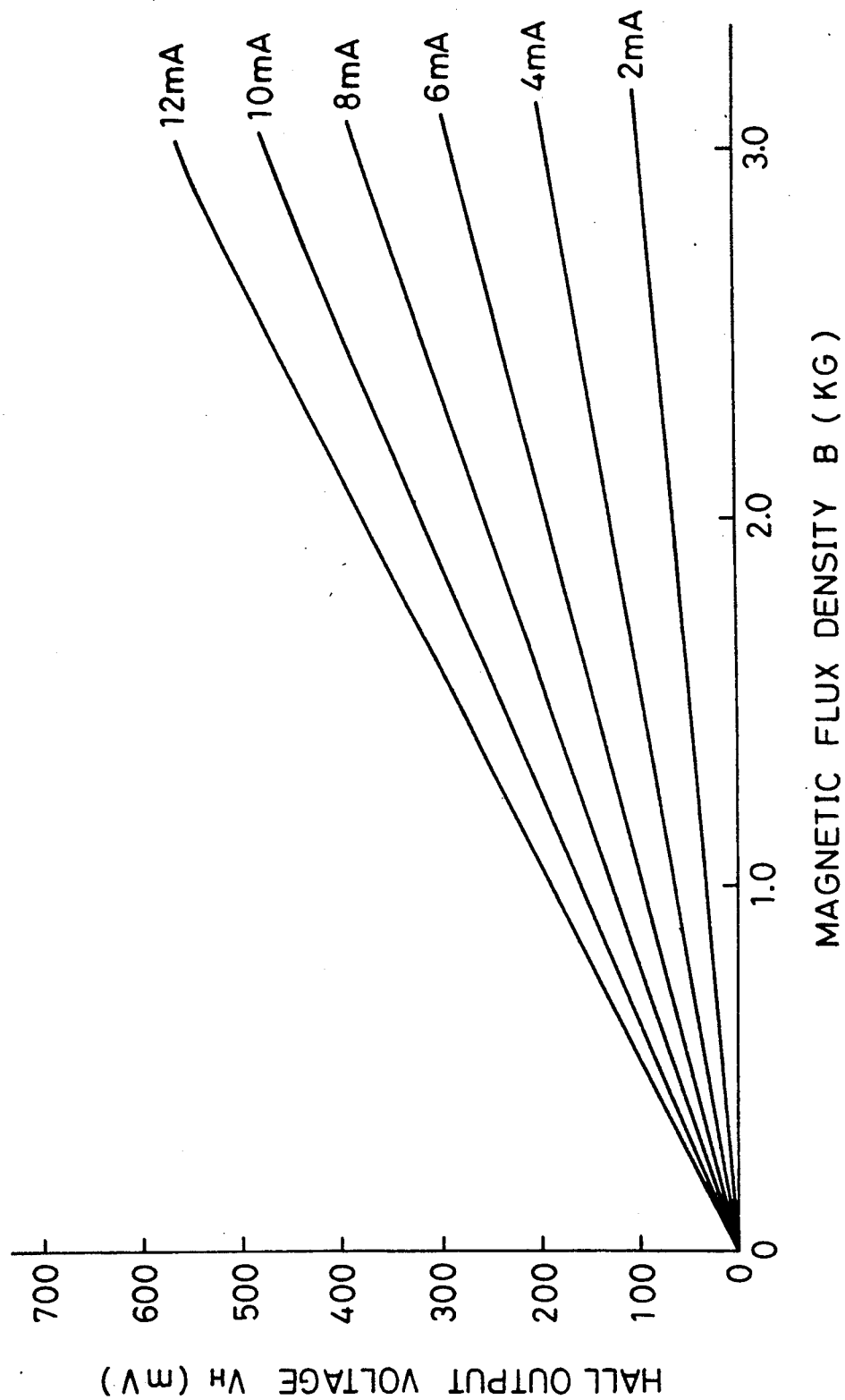
FIG. 17 is a graph illustrating magnetic field dependence of the Hall output voltage ($V_H$-B characteristics) of the InAs Hall element of the present invention at constant current driving.

FIGS. 16 and 17 illustrate the magnetic field properties of Hall output voltage of the InAs Hall element of the invention. Linearity of Hall output voltage versus magnetic flux density is also good.

PRODUCTION EXAMPLE 2

A wafer after Hall element pattern formation produced in the same manner as in Production Example 1 was subjected to rear side polishing of the GaAs substrate to reduce the thickness to 120 μm. Then, the wafer was cut by using a dicing saw. The above-described die bonding, wire bonding, surface protection with a silicone resin, and packaging with an epoxy resin process were followed. Thus, a thin mini-mold Hall element having a thickness of packaging of 0.60 mm was produced. In this case, the characteristics of the resulting Hall element were similar to the data in Production Example 1. The reliability was also equivalent thereto.

PRODUCTION EXAMPLE 3

A holder having a dozen of semi-insulating GaAs substrates of 0.3 mm thick and 2 inches in diameter with one of surfaces of each substrate being mirror surface-finished was set in a growing chamber under ultra high vacuum in a molecular-beam epitaxy apparatus. The substrate holder was rotated horizontally and the GaAs substrates were heated by a substrate heater. Here, charged evaporation sources for In, As and Si, i.e., K cells, were set up in the growth chamber in the same manner as production example 1. Next, In and As were evaporated from K cells, for 5 minutes under the conditions of a substrate temperature of 580° C., an In cell temperature of 750° C., an As beam of $3 \times 10^{-5}$ mb, and an Si cell temperature of 1,140° C., followed by surface smoothing treatment by interrupted growing, i.e., In and Si beam were shuttered for 2 minutes, and thereafter In, As and Si, were evaporated for 15 minutes. Thus, Si-doped InAs single crystal thin film having a thickness of 0.4 μm was formed by epitaxial growth on the mirror surface side of the substrate as shown in FIG. 3. After cooling it, the substrate was taken out from the molecular-beam epitaxy apparatus and its characteristics were measured. As a result, it had a sheet resistance of 130Ω and an electron mobility of 14,000 cm²/Vs.

Thus, InAs thin film as shown in FIG. 3 was produced. This had a low electron mobility layer in the vicinity of the interface with the GaAs substrate and a high electron mobility layer remote from the interface of the InAs thin film, and Si was doped as a donor impurity.

Then, using this InAs thin film, an InAs Hall element was produced in the same manner as in Production Example 1. In this case, too, the characteristics of the resulting Hall element were substantially the same and the reliability was equivalent thereto.

PRODUCTION EXAMPLE 4

A holder having a dozen of semi-insulating GaAs substrates of 0.3 mm thick and 2 inches in diameter with one of surfaces of each substrate being mirror surface-finished was set in a growing chamber under ultra high vacuum in a molecular-beam epitaxy apparatus. The substrate holder was rotated horizontally and the GaAs substrates were heated by a substrate heater. Here, charged evaporation sources for In, As and Si, i.e., K cells, were set up in the growth chamber in the same manner as production example 1. Next, In, As and Si were evaporated from K cell for 20 minutes under the conditions of a substrate temperature of 580° C., an In cell temperature of 750° C., an As beam of $3 \times 10^{-5}$ mb, and an Si cell temperature of 1,120° C. In this case, the temperature of Si cell was increased by 20° C. to 1,140° C. after initial 5 minutes had elapsed. In this manner, an Si-doped InAs single crystal thin film having a thickness of 0.4 μm was formed by epitaxial growth on the mirror surface side of the substrate in which the higher electron mobility portion of the thin film was doped with more Si. After cooling it, the substrate was taking out from the molecular-beam epitaxy apparatus and its characteristics were measured. As a result, it had a sheet resistance of 120Ω and an electron mobility of 14,100 cm$^2$/Vs.

Thus InAs thin film as shown in FIG. 3 was produced. This had a low electron mobility layer in the vicinity of the interface with the GaAs substrate and a high electron mobility layer remote from the interface of the InAs thin film, and Si was doped as a donor impurity.

Then, using this InAs thin film, an InAs Hall element was produced in the same manner as in Production Example 1. In this case, too, the characteristics of the resulting Hall element were substantially the same and the reliability was equivalent thereto.

PRODUCTION EXAMPLE 5

A holder having a dozen of semi-insulating GaAs substrates of 0.3 mm thick and 2 inches in diameter with one of surfaces of each substrate being mirror surface-finished was set in a growing chamber under ultra high vacuum in a large molecular-beam epitaxy apparatus. The substrate holder was rotated horizontally and the GaAs substrates were heated by a substrate heater. Here, charged evaporation sources for In, As and S, i.e., K cells, were set up in the growth chamber in the same manner as production example 1. Next, In and As were evaporated from K cells, for 20 minutes under the conditions of a substrate temperature of 580° C., an In cell temperature of 750° C., an As beam of $3 \times 10^{-5}$ mb, and S used as a dopant was evaporated starting from 5 minutes after the initiation of the evaporation and continued for 15 minutes. Thus, an S-doped InAs single crystal thin film having a thickness of 0.4 μm was formed by epitaxial growth on the mirror surface side of the substrate as shown in FIG. 3. After cooling it, the substrate was taken out from the molecular-beam epitaxy apparatus and its characteristics were measured. As a result, it had a sheet resistance of 120Ω and an electron mobility of 13,500 cm$^2$/Vs.

Then, using this InAs thin film, an InAs Hall element was produced in the same manner as in Production Example 1. In this case, too, the characteristics of the resulting Hall element were substantially the same and the reliability was equivalent thereto.

PRODUCTION EXAMPLE 6

A holder having a dozen of semi-insulating InP substrates of 0.3 mm thick and 2 inches in diameter with one of surfaces of each substrate being mirror surface-finished was set in a growing chamber under ultra high vacuum in a large molecular-beam epitaxy apparatus. The substrate holder was rotated horizontally and the InP substrates were heated by a substrate heater. Here, charged evaporation sources for In, As and Ge, i.e., K cells, were set up in the growth chamber in the same manner as production example 1. Next, In and As were evaporated from K cells, for 20 minutes under the same conditions as in Production Example 5, and Ge used as a dopant was evaporated starting from 5 minutes after the initiation of the evaporation and continued for 15 minutes. Thus, a Ge-doped InAs single crystal thin film having a thickness of 0.4 μm was formed by epitaxial growth on the mirror surface side of the substrate as shown in FIG. 3. After cooling it, the substrate was taken out from the molecular-beam epitaxy apparatus and its characteristics were measured. As a result, it had a sheet resistance of 110Ω and an electron mobility of 13,000 cm$^2$/Vs.

Then, using this InAs thin film, an InAs Hall element was produced in the same manner as in Production Example 1. In this case, too, the characteristics of the resulting Hall element were substantially the same and the reliability was equivalent thereto.

PRODUCTION EXAMPLE 7

On a surface of an InAs thin film formed on a GaAs substrate by epitaxial growth in the same manner as in Production Example 1, was formed the first resist of a predetermined shape by a technique of photolithography, and then films of Au-Ge 2,500 Å, Ni 500 Å, and Au 3,000 Å were formed sequentially over the entire surface by vacuum deposition method. Subsequently, the resist and metal on the resist were simultaneously removed by a lift-off method to form an electrode composed of three layers. Then, the second resist pattern was formed by a technique of photolithography thereon. Using this resist as a mask, the InAs thin film was etched out by wet etching. Further, over all the surface was formed a film of Si$_3$N$_4$ to a thickness of 3,000 Å as an insulating layer by plasma CVD method at a substrate temperature of 300° C. A resist pattern was formed thereon by the same photolithographic method as described above to form a resist pattern and the Si$_3$N$_4$ on the electrode portion was removed by reactive ion etching. By these steps, about 2,500 Hall elements as shown in FIG. 1A were prepared on a substrate.

Then, after reducing the thickness of the substrate to 120 μm by rear side polishing, a ferrite plate having a thickness of 300 μm was bonded to the rear side of the substrate with an epoxy resin. Then, the Hall elements on the substrate were divided into a number of individual Hall element chips of the present invention as shown in FIGS. 7A and 7B by using a dicing saw, and the resulting Hall element chips were die bonded on an island portion of a lead with an electroconductive epoxy resin using an automatic die bonder, followed by connecting the lead to the electrode portion of the Hall element with an Au wire using an automatic wire bonder. Then, a silicone resin was coated on the chip surface of the Hall element to protect it, and molded in an epoxy resin using a transfer molder. The molded Hall element was subjected to lead cutting and finished into individual resin molded Hall elements as shown in FIG. 8.

Table 9 shows representative characteristics of the thus produced Hall element. As compared with elements in production example 1 having no magnetic amplifying structure, the Hall element of the present example realized large Hall output voltage of about 1.6 times by magnetic amplifying effect, and exhibited the Hall output voltage equivalent to that of a magnetic amplifying type InSb Hall element driven at room temperature under at rated driving conditions.

Figure 18:
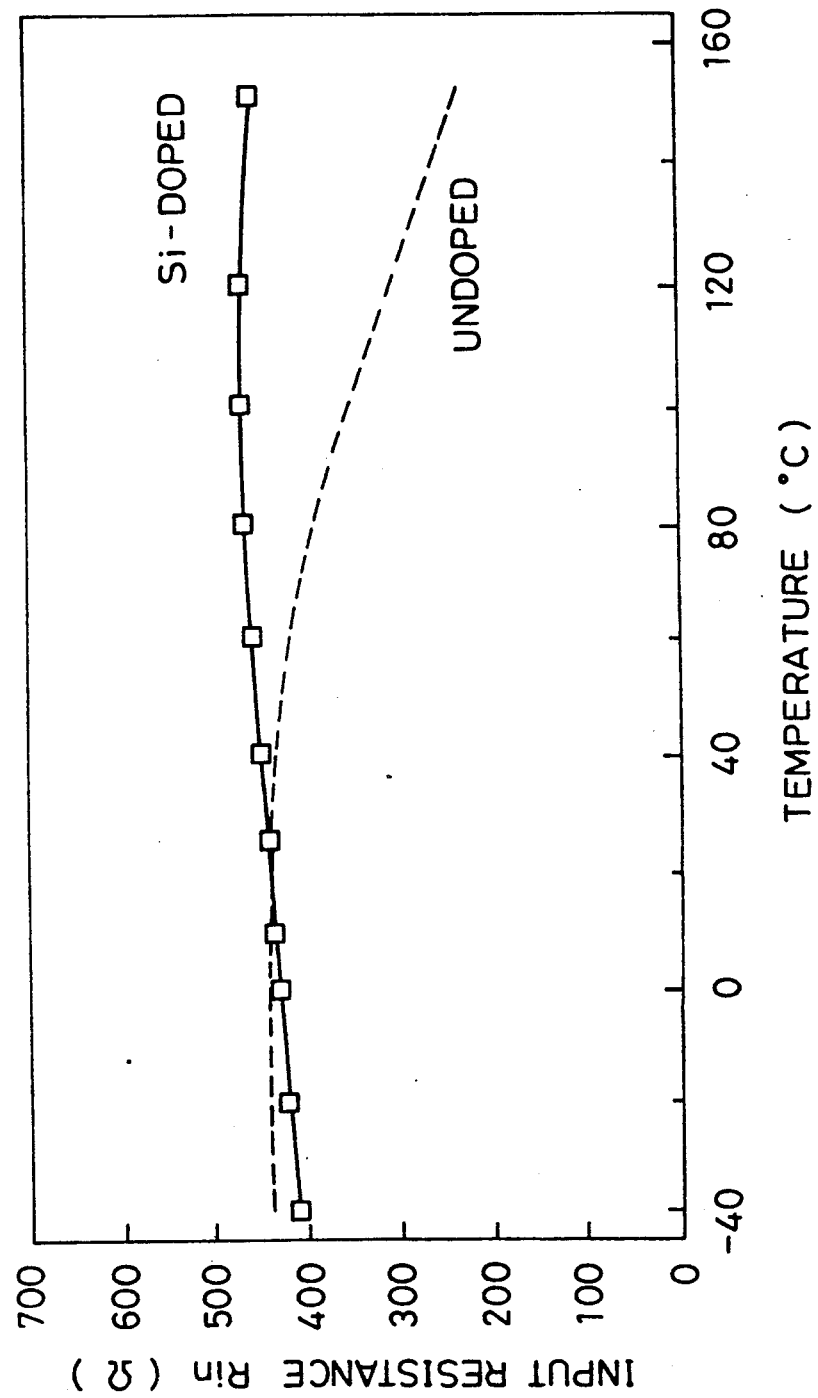
FIG. 18 is a graph illustrating the temperature dependence of input resistance of the InAs Hall elements provided with a body of a ferromagnetic material according to the present invention.
Figure 19:
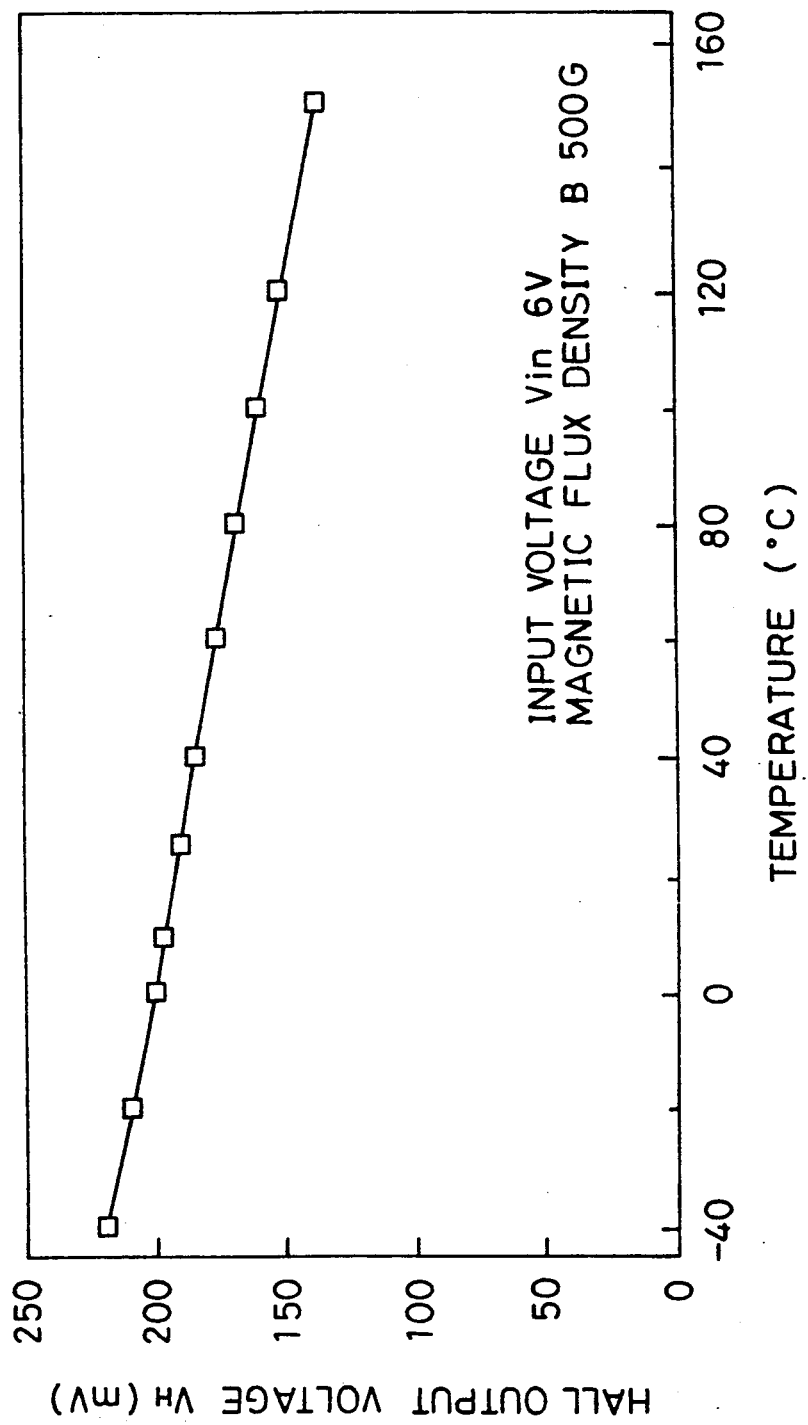
FIG. 19 is a graph illustrating the temperature dependence of Hall output voltage of the InAs Hall element provided with a body of a ferromagnetic material according to the present invention at constant voltage driving.
Figure 20:
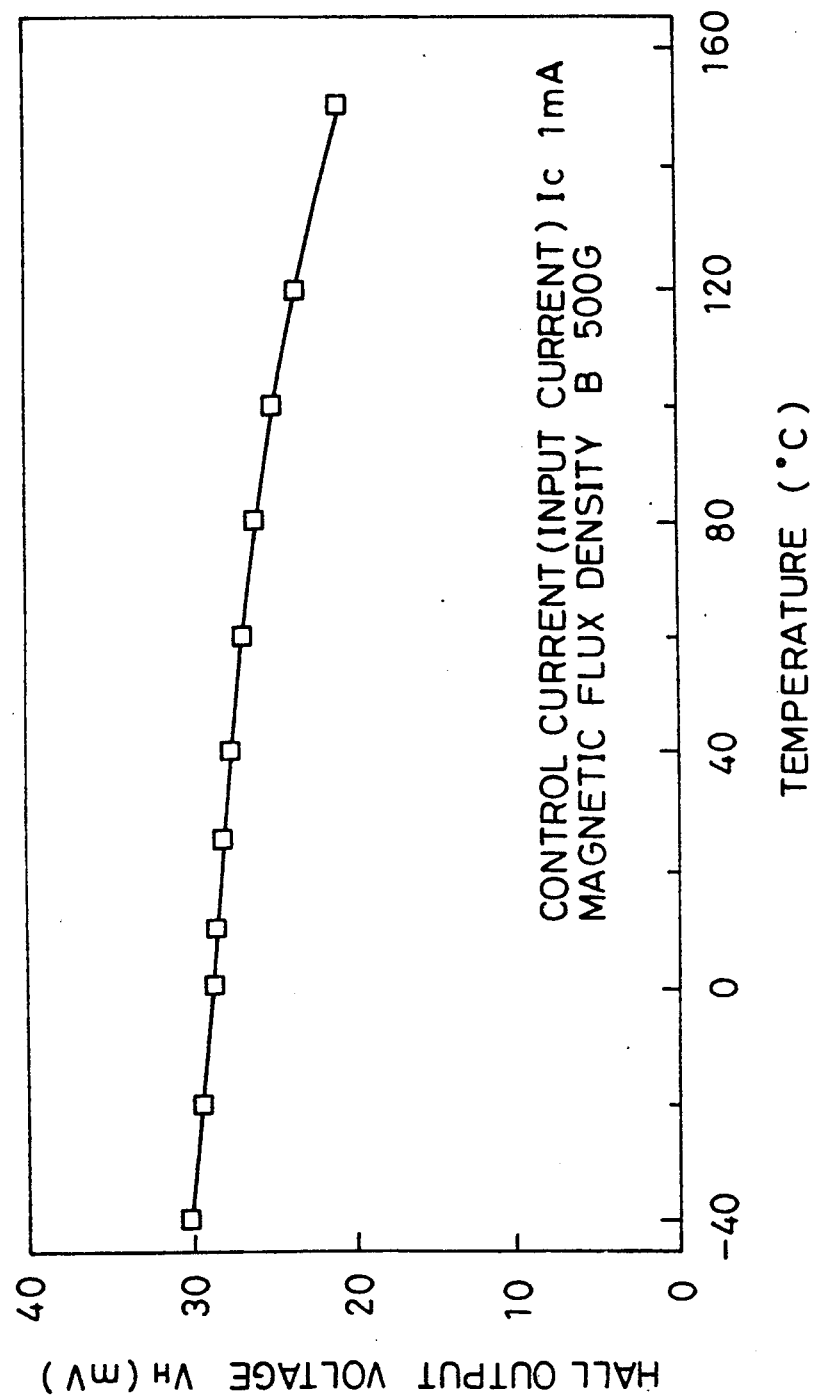
FIG. 20 is a graph illustrating the temperature dependence of Hall output voltage of the InAs Hall element provided with a ferromagnetic material according to the present invention at constant current driving.

FIGS. 18, 19 and 20 illustrate the temperature characteristics of the Hall element of the present invention, respectively. FIG. 18 illustrates behavior of temperature dependency of the input resistance of the Hall element of the invention, indicating that the temperature-dependent change decreased greatly by reflecting the characteristics of the thin film as shown in FIG. 5. Here, solid line designates the temperature characteristics of the resistance of the InAs Hall element of the invention while broken line indicates the temperature characteristics of the resistance of the undoped InAs Hall element taken for comparison. From FIG. 18, it can be seen that the Hall element of the present invention has good temperature characteristics of the input resistance which does not decrease up to 150° C., and magnetic amplification does not alter the temperature characteristics. Further, from FIGS. 19 and 20, it can be seen that the temperature-dependent change in Hall output voltage is very small up to 150° C. Because change in resistance depending on temperature is small and remains substantially at a constant level, the temperature-dependent change in offset voltage at zero magnetic field becomes very small as compared with the conventional Hall element.

TABLE 9

Typical Hall output voltage of InAs Hall element at constant voltage driving (comparison at rated values)

| InAs Hall Element of Invention | Conventional InSb Hall Element |
| --- | --- |
| 190 mV/6 V · 500 G | 180 mV/1 V · 500 G (GAUGS) |

PRODUCTION EXAMPLE 8

On an upper surface of the magneto-sensitive portion of the Hall element, after the die bonding and wire bonding produced in the same manner as in Production Example 7, a ferrite piece of a cube of 0.35 mm×0.35 mm×0.35 mm with a silicone resin was bonded. Then, this was packaged with an epoxy resin to produce a Hall element having a ferromagnetic material on each side thereof as shown in FIG. 9. Upon measurement of its characteristics, results as shown in Table 10 were obtained.

The provision of the second ferromagnetic material realized a higher sensitivity by 2.5 times as high as the InSb Hall element.

TABLE 10

Typical Hall output voltage of InAs Hall element at constant voltage driving (comparison at rated values)

| InAs Hall Element of Invention | Conventional InSb Hall Element |
| --- | --- |
| 450 mV/6 V · 500 G | 180 mV/1 V · 500 G |

PRODUCTION EXAMPLE 9

On an upper surface of the magneto-sensitive portion of the Hall element, after the die bonding and wire bonding produced in the same manner as in Production Example 7, a small sized magnetic material of a mixture of a silicone resin containing 90% by weight of ferrite powder was placed and cured. Then, this was packaged with an epoxy resin to produce a Hall element having ferromagnetic material on each side thereof as shown in FIG. 10. Upon measurement of its characteristics, results as shown in Table 11 were obtained.

The provision of the second ferromagnetic material realized a higher sensitivity by 1.6 times as high as the InSb Hall element.

TABLE 11

Typical Hall output voltage of InAs Hall element at constant voltage driving (comparison at rated values)

| | InAs Hall Element of Invention | Conventional InSb Hall Element |
| --- | --- | --- |
| Constant voltage output | 290 mV/6 V · 500 G | 180 mV/1 V · 500 G |

As described in the foregoing, the InAs Hall element of the present invention achieved the stable operation at low to high temperatures, i.e. the stable operation to 150° C. The InAs Hall element of the invention does not show a self-breaking mode at high temperatures and has a high sensitivity and high Hall output Voltage as well as being highly reliable. Further, when a magnetic amplifying structure is added, the InAs Hall element of the invention can generate the large Hall output voltage and this large Hall output voltage is larger than the Hall output voltage of conventional InSb Hall element of a magnetic amplifying type. In other words, the Hall element of the invention may be realized as a Hall element which can be operated at a higher temperature range above 100° C. at which conventional InSb Hall element cannot be used, and have the large Hall output voltage superior to such InSb Hall element.

The Hall element of the present invention has a special characteristic in that the input resistance value changes very little with temperature.

This causes the very small temperature dependent change of the offset voltage at zero magnetic field and a simple and low cost electric current source is possible to drive this Hall element.

Thus, according to the present invention, improvement of characteristics and reliability which could not be thought of in the conventional techniques as well as broadening of the temperature range within which the element can be operated have been achieved. The element of the present invention can be produced by wafer process such as photolithography, by etching electrode formation and the like commonly used in the mass production process of semiconductors and, thus, amenable to mass production, which is very advantageous from a point of view of industrial application.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as falling within the true spirit of the invention.

What is claimed is:

1. A magnetoelectric transducer, comprising:
an insulating substrate; and
an InAs epitaxial thin film overlaying said insulating substrate as a magneto-sensitive portion, said InAs thin film having a thickness of 0.2 to 1.4 μm and having two portions different in electron mobility with each other, said portions including a higher electron mobility portion and a lower electron mobility portion, said higher electron mobility portion being doped with a donor impurity.

2. A magnetoelectric transducer as claimed in claim 1, wherein said donor impurity is at least one element selected from the group consisting of Si, S, Ge, Se, and Sn.

3. A magnetoelectric transducer as claimed in claim 2, wherein said magnetoelectric transducer is a Hall element.

4. A magnetoelectric transducer as claimed in claim 1, further comprising a body of a ferromagnetic material arranged close to at least one side of said magneto-sensitive portion.

5. A magnetoelectric transducer as claimed in claim 4, wherein said donor impurity is at least one element selected from the group consisting of Si, S, Ge, Se, and Sn.

6. A magnetoelectric transducer as claimed in claim 5, wherein said magnetoelectric transducer is a Hall element.

7. A magnetoelectric transducer claim 4, wherein said magnetoelectric transducer is a Hall element.

8. A magnetoelectric transducer as claimed in claim 1, wherein said magnetoelectric transducer is a Hall element.

9. A magnetoelectric transducing device, comprising:
a magnetoelectric transducer including, an insulating substrate, and InAs epitaxial thin film overlaying said insulating substrate as a magneto-sensitive portion, said InAs thin film having a thickness of 0.2 to 1.4 μm and having two portions different in electron mobility, said portions including a higher electron mobility portion and a lower electron mobility portion, said higher electron mobility portion being doped with a donor impurity; and
a circuit element connected electrically to said magnetoelectric transducer, said magnetoelectric transducer and said circuit element are in one package.

10. A magnetoelectric transducing device as claimed in claim 9, wherein said magnetoelectric transducer is a Hall element.

11. A magnetoelectric transducing device, comprising:
a magnetoelectric transducer including, an insulating substrate, an InAs epitaxial thin film overlaying said insulating substrate as a magneto-sensitive portion, said InAs thin film having a thickness of 0.2 to 1.4 μm and having two portions different in electron mobility, said portions including a higher electron mobility portion and a lower electron mobility portion, said higher electron mobility portion being doped with a donor impurity, and a body of a ferromagnetic material disposed close to at least one side of said magneto-sensitive portion; and
a circuit element connected electrically to said magnetoelectric transducer, said magnetoelectric transducer and said circuit element are in one package.

12. A magnetoelectric transducing device as claimed in claim 11, wherein said magnetoelectric transducer is a Hall element.

13. A magnetic switch, comprising:
a magnetoelectric transducer including, an insulating substrate, an InAs epitaxial thin film overlaying said insulating substrate as a magneto-sensitive portion, said InAs thin film having a thickness of 0.2 to 1.4 μm and having two portions different in electron mobility, said portions including a higher electron mobility portion and a lower electron mobility portion, said higher electron mobility portion being doped with a donor impurity; and
means for applying a magnetic field to drive said magnetoelectric transducer.

14. A magnetic switch as claimed in claim 13, wherein said magnetoelectric transducer is a Hall element.

15. A magnetic switch, comprising:
a magnetoelectric transducer including, an insulating substrate, an InAs epitaxial thin film overlaying said insulating substrate as a magneto-sensitive portion, said InAs thin film having a thickness of 0.2 to 1.4 μm and having two portions different in electron mobility, said portions including a higher electron mobility portion and a lower electron mobility portion, said higher electron mobility portion being doped with a donor impurity, and a body of a ferromagnetic material arranged close to at least one side of said magneto-sensitive portion; and
means for applying a magnetic field to drive said magnetoelectric transducer.

16. A magnetic switch as claimed in claim 15, wherein said magnetoelectric transducer is a Hall element.

17. A process for producing a magnetic sensor including an insulating substrate and an InAs thin film having a first portion and a second portion, said first and second portions having different electron mobilities, said process comprising the steps of:
forming an InAs thin film on said insulating substrate by epitaxial growth; and
doping said second portion of said InAs thin film with donor impurity atoms, said second portion having a higher electron mobility than said second portion.

18. A process as claimed in claim 17, further comprising the step of arranging a body of a ferromagnetic material on at least one side of said magneto-sensitive portion made of said InAs thin film.

19. A process as claimed in claim 18, wherein said step of forming said InAs thin film by epitaxial growth and the step of doping said second portion of said InAs thin film with said donor impurity atoms are carried out simultaneously.

20. A process as claimed in claim 17, wherein said step of forming said InAs thin film by epitaxial growth and the step of doping said second portion of said InAs thin film with said donor impurity atoms are carried out simultaneously.

* * * * *